US012757776B2

(12) United States Patent
Livengood et al.

(10) Patent No.: US 12,757,776 B2
(45) Date of Patent: Oct. 6, 2026

(54) GATE-ALL-AROUND TRANSISTOR CIRCUIT MODIFICATION USING DIRECT CONTACT AND/OR ACCESS PROBE POINTS

(71) Applicant: Intel Corporation, Santa Clara, CA (US)

(72) Inventors: Richard H. Livengood, San Jose, CA (US); Muhammad Usman Raza, Fremont, CA (US); Waqas Ali, San Jose, CA (US); Tahir Malik, Portland, OR (US); Shida Tan, Saratoga, CA (US); Martin Von Haartman, Portland, OR (US); Mauro Kobrinsky, Portland, OR (US); Amir Raveh, Haifa (IL); Clifford J. Engle, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 266 days.

(21) Appl. No.: 17/856,777

(22) Filed: Jul. 1, 2022

(65) Prior Publication Data

US 2024/0006302 A1 Jan. 4, 2024

(51) Int. Cl.

| | |
|---|---|
| ***H10W 72/00*** | (2026.01) |
| ***H10D 30/67*** | (2025.01) |
| ***H10D 62/10*** | (2025.01) |
| ***H10D 62/13*** | (2025.01) |
| ***H10W 20/41*** | (2026.01) |

(52) U.S. Cl.

CPC ........ *H10W 72/00* (2026.01); *H10D 30/6735* (2025.01); *H10D 30/6757* (2025.01); *H10D 62/121* (2025.01); *H10D 62/156* (2025.01); *H10W 20/427* (2026.01)

(58) Field of Classification Search

CPC ............................... H10W 72/00; H01L 23/50

See application file for complete search history.

(56) References Cited

U.S. PATENT DOCUMENTS

| | | | | |
|---|---|---|---|---|
| 2004/0232414 A1* | 11/2004 | Suthar | H10W 70/092 257/48 |
| 2006/0214204 A1 | 9/2006 | Yoo et al. | |
| 2007/0045689 A1 | 3/2007 | Lim et al. | |
| 2016/0217931 A1 | 7/2016 | Saita et al. | |
| 2020/0294998 A1* | 9/2020 | Lilak | H10D 84/0149 |
| 2022/0102483 A1 | 3/2022 | Sounart et al. | |

* cited by examiner

*Primary Examiner* — Zandra V Smith
*Assistant Examiner* — Krishna J Palaniswamy
(74) *Attorney, Agent, or Firm* — Essential Patents Group, LLP

(57) ABSTRACT

Techniques and structures are disclosed related to coupling to gate-all-around transistors for test and/or debug of an integrated circuit. The gate-all-around transistors, which may also be referred to as 3D stacked transistors or ribbon-FET transistors are contacted directly from the back side or they are contacted using a dedicated probe point on the back side of the gate-all-around transistors. Such contact may be made to probe the devices and/or to provide edit wires to modify the integrated circuit.

14 Claims, 18 Drawing Sheets

GATE-ALL-AROUND TRANSISTOR CIRCUIT MODIFICATION USING DIRECT CONTACT AND/OR ACCESS PROBE POINTS

BACKGROUND

Fault isolation and failure analysis are critical parts of integrated circuit product design validation and debug, process development, production yield improvement, reliability testing, product certification, and product reliability qualification. The ability to identify and isolate failing circuits and devices often defines the success or failure of a product launch. For example, new product debug requires validating design changes and generating engineering samples to enable further validation of design and debug of design and/or process marginality and logic issues. Furthermore, new products require circuit level analysis to debug timing, power, process, and design marginality. Current techniques include probing through the silicon substrate, mechanical probing using focused ion beam deposited connections designed into lower metal routing layers, and circuit editing on front end metal interconnect layers. However, such techniques are limited in terms of access to advanced architectures while becoming more critical in the context of increasing demands for faster product ramps.

It is with respect to these and other considerations that the present improvements have been needed. Such improvements may become critical as the desire to perform fault isolation, failure analysis, and debug on integrated circuits becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
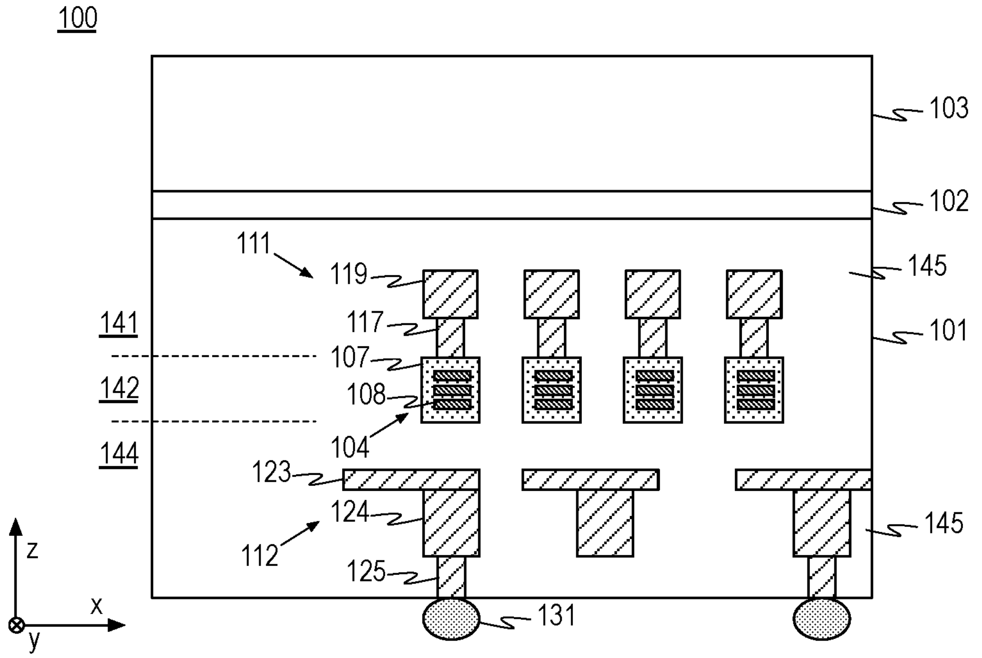
FIGS. 1A and 1B illustrate cross-sectional side views of an example integrated circuit (IC) structure including a number of gate-all-around transistors.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direction contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "predominantly" indicates the predominant constituent is the constituent of greatest proportion in the layer or material. For example, a material including predominantly a particular constituent is not less than 51% of the particular constituent. The term "substantially pure" indicates a material of not less than 95% of the particular constituent. The term "nearly pure" indicates a material of not less than 99% of the particular constituent and the term "pure" indicates a material of not less than 99.9% of the particular constituent. Such material percentages are given based on weight percentage unless otherwise indicated.

Techniques, test structures, devices, and integrated circuits are described herein related to accessing and optionally modifying gate-all-around transistor device structures for integrated circuit test, design validation, and similar operations.

As described above, identifying and isolating failing circuits and devices, as well as identifying and validating design changes is an important aspect of integrated circuit production, with improvements in such fields providing the ability to quickly launch new products, adjust process parameters for existing product lines, detect failures, validate circuit redesigns, and so on. The techniques discussed herein provide for the test and/or modification of gate-all-around (GAA) transistor circuits. In some embodiments, the GAA transistors are contacted directly from the back side using focused ion beam (FIB) machining and ion beam induced deposition (IBID). For example, the gate, source, or drain of a GAA transistor is exposed from the back side and contacted by one end of a wire, and a second end of the wire is coupled to a gate, a source, or a drain of another GAA transistor, or another pertinent circuit structure such as metallization feature, metal line, or the like.

In some embodiments, an access probe or probe point structure is provided on a back side of one or more of a gate, a source, or a drain of a GAA transistor. When needed for testing or circuit modification, the probe point structure is exposed. The exposed probe point structure may then be contacted by a probe tip or e-beam, for example, and used as a test location contact point. In addition or in the alternative, the exposed probe point structure may be contacted by a first end of a wire that includes a second end coupled to a gate, a source, or a drain of another GAA transistor, or another pertinent circuit structure.

Such circuit testing and/or modification may be performed as needed for any test, circuit adjustment, validation, or the like. For example, in production cycles, early production lines often include engineering guard bands or process marginalities that are later reduced or pushed to their limits in later production lines. When problems occur in such product revisions, potential fixes (i.e., for validation of new lithography mask sets) can be validated using the techniques discussed herein. Providing efficient validations reduces the time needed to understand and evaluate such fixes, which in turn can shorten product cycles and increase yields. Other contexts for circuit adjustments include proposed routing changes, circuit reconfigurations, etc. The techniques discussed herein may be used in a wide array of test, debug, and process or design improvement contexts. Furthermore, the techniques discussed herein may advantageously be deployed in a variety of points in the process flow. This provides flexibility to such test, debug, and process or design improvement. As discussed further herein below, the discussed techniques may be deployed when an integrated circuit (IC) is being manufactured at the wafer level (i.e., test and/or edit on wafer), when an IC is in a die or a die stack prior to package (i.e., test and/or edit prior to assembly), when an IC is in a packaged die (i.e., test and/or edit post assembly), or others. Other advantages will be evident based on the following description.

Figure 1B:
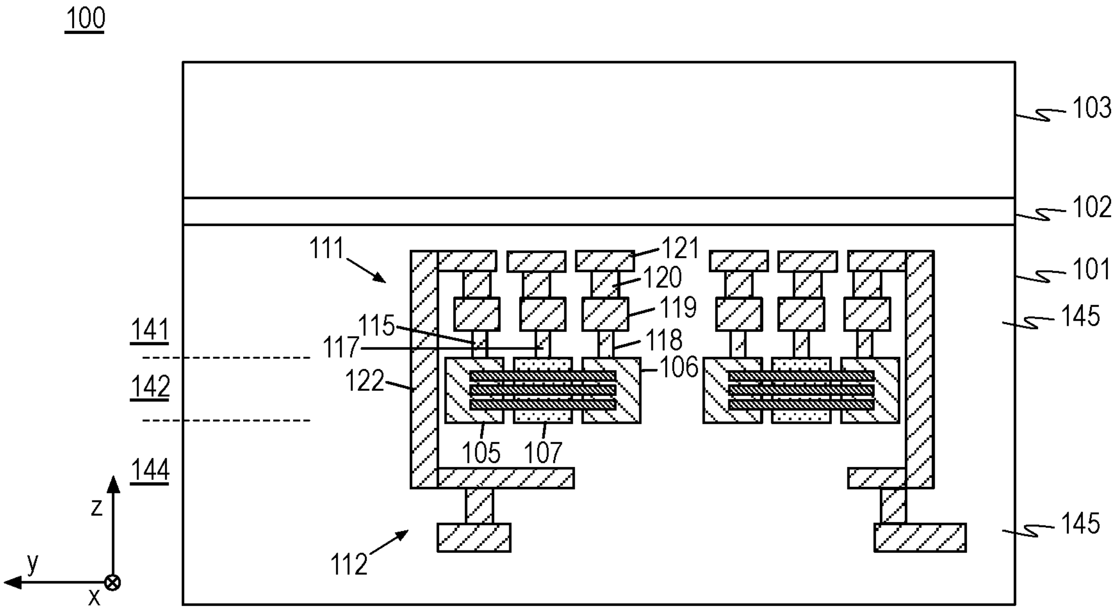

FIGS. 1A and 1B illustrate cross-sectional side views of an example integrated circuit structure 100 including a number of gate-all-around transistors 104, arranged in accordance with at least some implementations of the present disclosure. A gate-all-around transistor, also known as a 3D stacked transistor or a Ribbon-FET transistor, is a multi-gate device that integrates more than one channel structure into a single FET device. In FIG. 1A, a gate cut view (orthogonal to channel view) is provided such that the view is a cut through the gates of gate-all-around (GAA) transistors 104. This view is looking into the x-z plane. In FIG. 1B, a channel cut view (parallel to channel view) is provided such that the view is a cut through the channel structures of GAA transistors 104. This view is looking into the y-z plane and is orthogonal to the view of FIG. 1A. Integrated circuit (IC) structure 100 includes a lateral surface along the x-y plane that may be defined or taken at any vertical position of IC structure 100. The lateral surface of the x-y plane is orthogonal to a vertical or build up dimension as defined by the z-axis. Furthermore, in accordance with use in the art, the terms top, front side, and similar terms are in reference to the positive z-direction and the terms bottom, back side, and similar terms are in reference to the negative z-direction. For example, the terms top and front side may be used substantially interchangeably and, similarly, the terms bottom and back side may be used substantially interchangeably.

Such cross-sectional side views and orientations are maintained in FIGS. 2A, 2B, 3A, 3B, 5A, 4B, 5A, 5B, 8A, 8B, 9A, 9B, 10A, 10B, 11A, 11B, 12A, 12B, 13A, 13B, 14A, and 14B herein with FIGS. 1A-5A and 8A-14A illustrating gate cut views and FIGS. 1B-5B and 8B-14B illustrating channel cut view. Notably, FIGS. 1A, 1B, 2A, 2B, 3A, 3B, 5A, 4B, 5A, 5B, 8A, 8B, 9A, 9B, 10A, 10B, 11A, 11B, 12A, 12B, 13A, 13B, 14A, and 14B illustrate exemplary IC structures as various operations are performed, arranged in accordance with at least some implementations of the present disclosure. Such operations provide for methods of editing an IC structure and/or testing an IC structure.

As shown in FIGS. 1A and 1B, IC structure 100 includes an IC device 101 coupled to a carrier 103 by adhesion layer 102. IC device 101 may be a wafer or die, for example, in some embodiments, carrier 103 is a carrier wafer. In some embodiments, IC device 101 is coupled to carrier 103 using bonding oxides. For example, GAA transistors 104 of IC device 101 may have been fabricated on, in, and over a substrate such as a silicon substrate. A layer including GAA transistors 104 may be characterized as a device layer 142 (i.e., a transistor device layer or the like). Subsequently, front side metallization layers 141 may be formed over device layer 142. The substrate may then be coupled to carrier 103 by adhesion layer 102, and the substrate material or a majority of the substrate material may then be removed by back side grind, back side etch, or similar techniques. Subsequently, back side metallization layers 144 and interconnects 131 are formed. As shown, front and back side metallization layers 141, 144 are embedded within dielectric materials 145. Although illustrated with respect to IC device 101 being processed subsequent to such processing but prior to die separation, die to die stacking, and/or packaging, the following operations may be performed in any suitable context.

As shown in FIG. 1B, GAA transistors 104 each include a gate structure 107 between a source 105 and a drain 106. As shown in FIG. 1A, gate structure 107 wraps around each of channel structures 108. Channel structures 108 may include any suitable semiconductor materials such as monocrystalline silicon. Although illustrated with three channel structures 108, any number may be used Channel structures 108 extend laterally and may be characterized as nanowires, nanosheets, ribbons, or the like. Gate structure 107 includes a gate dielectric (not shown) on and surrounding each of channel structures 108 and a gate electrode (illustrated as gate structure 107) on and surrounding the gate dielectric, and surrounding each of channel structures 108. As used herein, the term GAA transistor indicates a device having one or more channel structures or channel semiconductors contacted and surrounded on all sides in the x-z plane by gate structure 107. A gate-all-around transistor may also be referred to as a 3D stacked transistor or ribbon-FET transistor. Such GAA transistors may be contrasted with planar or FinFET transistors where one or more surfaces are not contacted by the gate structure.

Channel structures 108 are also contacted on lateral ends thereof by source 105 and drain 106. In some embodiments, source 105 and drain 106 are epitaxial source and drain structures grown from exposed portions of channel structures 108. As discussed, channel structures 108 may be any suitable semiconductor material such as crystalline silicon. The discussed gate dielectric may be silicon oxide, silicon dioxide ($SiO_2$), and/or a high-k dielectric material such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate electrode may be polysilicon and/or a p-type work function metal or an n-type work function metal, depending on whether the GAA transistor is a PMOS or an NMOS transistor. Exemplary gate electrode materials include ruthenium, palladium, platinum, cobalt, nickel, hafnium, zirconium, titanium, tantalum, aluminum, alloys of these metals, or conductive metal oxides.

As shown, components of GAA transistors 104 are contacted from a front side by source contact 115, gate contact 117, and drain contact 118 of front side metallization layers 141. Further layers of metallization of front side metallization layers 141 inclusive metallization features 119, 120, 121, and so on, are used to provide signal and power routing 111 for GAA transistors 104. Metallization features 119 may also be characterized as source, gate, and drain contacts. As used herein, the term metallization layer indicates metal interconnections or wires and/or metal vias that provide electrical routing and, optionally, the dielectric material that electrically isolates the metallization interconnects. Adjacent metallization layers may be interconnected by vias that may be characterized as part of the metallization layers or between the metallization layers. As shown, in some embodiments, front side metallization layers 141 are formed over and immediately adjacent GAA transistors 104. Front side metallization layers 141 are embedded within dielectric materials 145.

Similarly, layers of metallization of back side metallization layers 144 inclusive metallization features 123, 124, 125, and so on, are used to provide signal and power routing 112. As shown, in some embodiments, front side metallization layers 141 are coupled to back side metallization layers 144 by vias 122 that traverse device layer 142. Such vias 122 may be characterized as deep vias. Back side metallization layers 144 and vias 122 are also embedded within dielectric materials 145. The metallization features of front and back side metallization layers 141, 144, vias 122, and so on may be any suitable conductive material such as copper, optionally lined with known seed and/or barrier metallizations. Notably, such metallization features may have different characteristics with respect to directly written edit wiring discussed further herein below.

Figure 2A:
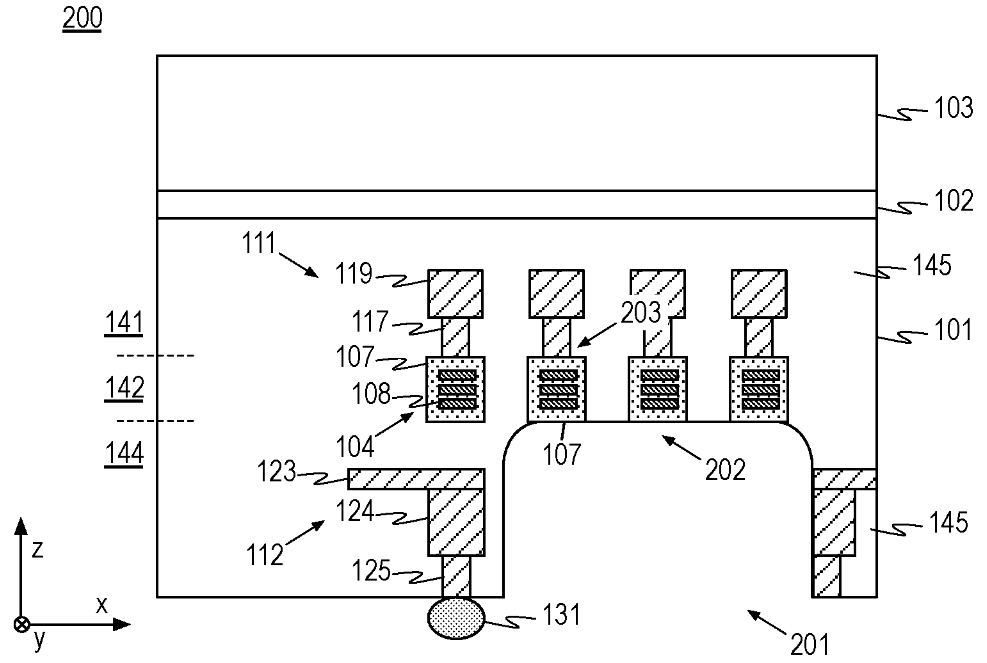
FIGS. 2A and 2B illustrate cross-sectional side views of an example IC structure similar to the IC structure of FIGS. 1A and 1B, after the removal of a portion of back side metallization layers to expose back side surfaces of the gate-all-around transistors.
Figure 2B:
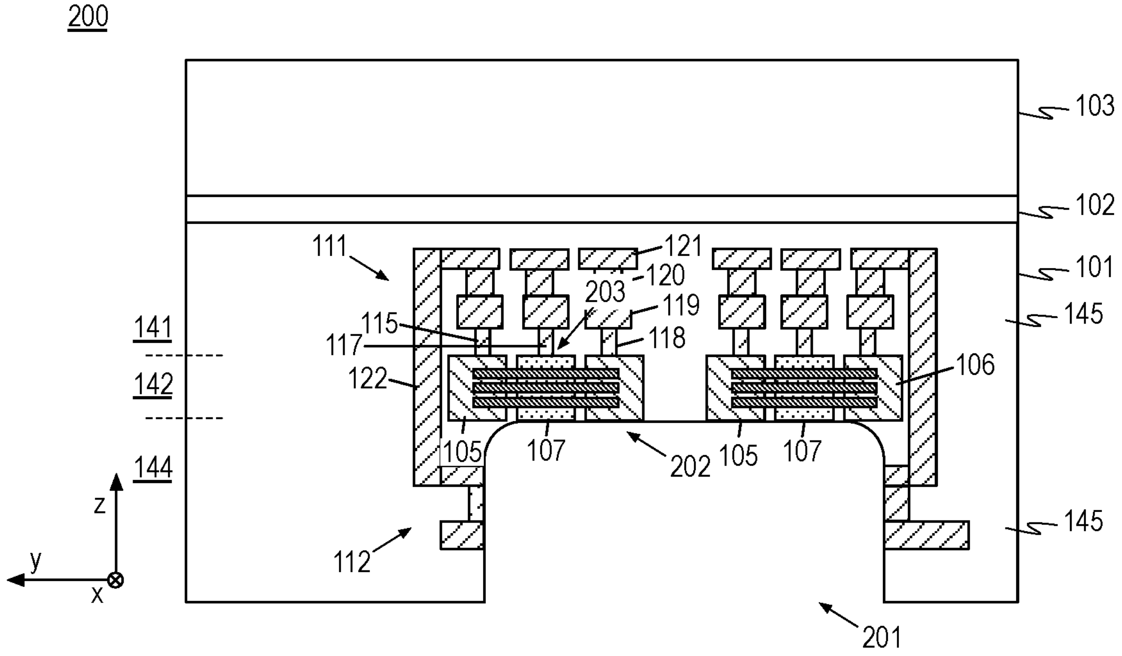

FIGS. 2A and 2B illustrate cross-sectional side views of an example IC structure 200 similar to IC structure 100, after the removal of a portion of back side metallization layers 144 to expose back side surfaces 202 of GAA transistors 104. Portions of back side metallization layers 144 may be removed to form one or more openings 201. Openings 201 provide access to back side surfaces 202 of GAA transistors 104. Such back side surfaces 202 may be surfaces of one or more of sources 105, drains 106, and gate structures 107. Notably, with reference to FIGS. 1A and 1B and FIGS. 2A and 2B, IC structure 100 is received such that IC structure 100 includes any number of GAA transistors 104. Each GAA transistor 104 includes a gate structure 107 between a source 105 and a drain 106. IC structure 100 further includes gate contacts 117, source contacts 115, and drain contacts 118 on front side surfaces 203 of gate structures 107, sources 105, and drains 106, respectively. For example, such front side surfaces 203 may extend substantially laterally (i.e., in the x-y plane) and are oriented such that they face (e.g., a vector normal from such surfaces extends) in the positive z-direction, which as discussed, is the typical build up direction of device layer 142.

Back side surfaces 202 are then exposed as shown with respect to IC structure 200 of FIGS. 2A and 2B. Any number of components may be exposed in such processing. In the illustrated example, a gate structure 107 and a drain 106 of one GAA transistors 104 (i.e., the left GAA transistor in FIG. 2B) is exposed and a source 105 and a gate structure 107 of another GAA transistors 104 (i.e., the right GAA transistor in FIG. 2B) are exposed. However, sources 105, gate structures 107, and drains 106 may be exposed in any combination by any number of openings 201.

For example, openings 201 may be patterned to expose desired ones of sources 105, gate structures 107, and drains 106, as well as other circuit features. Such patterning may be defined to provide openings 201 that allow access to back side surfaces 202 of sources 105, gate structures 107, drains 106, and/or other circuit features that are needed for the desired modification or edit to be performed. Such edit or modification options are discussed further herein below.

Openings 201 may be formed by removal of back side metallization layers 144 using any suitable technique or techniques. In some embodiments, the portions of back side metallization layers 144 are removed using patterning and etch techniques. In some embodiments, the portions of back side metallization layers 144 are removed by physical machining. In some embodiments, the portions of back side metallization layers 144 are removed by electrochemical machining. In some embodiments, the portions of back side metallization layers 144 are removed by FIB machining or ablation. In some embodiments, the portions of back side metallization layers 144 are removed using laser ablation techniques. Such material removal techniques may be used in combination and/or other techniques may be deployed.

Figure 3A:
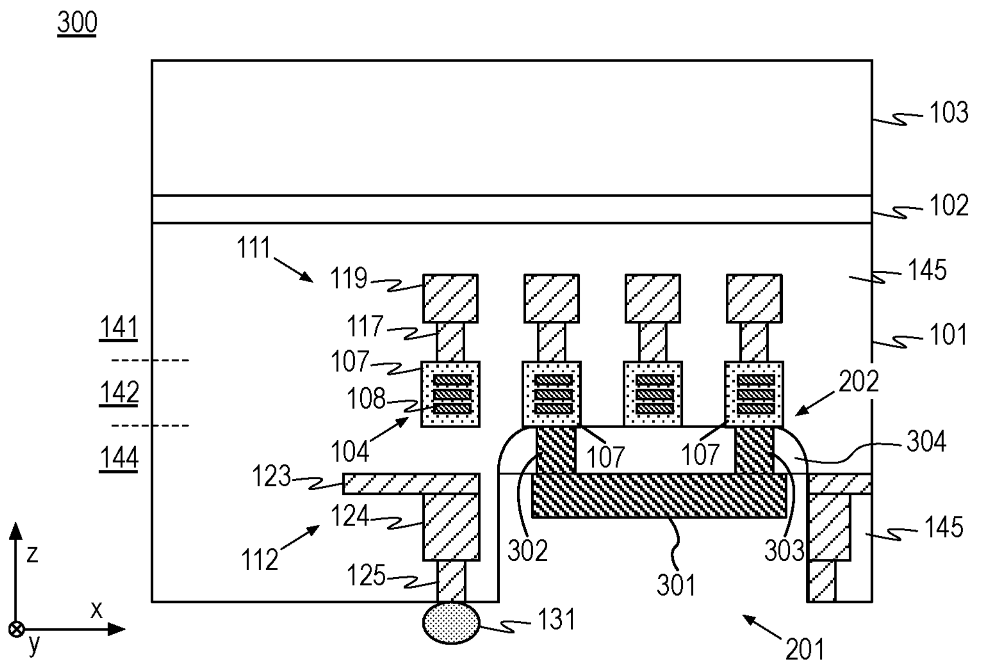
FIGS. 3A and 3B illustrate cross-sectional side views of an example IC structure similar to the IC structure of FIGS. 2A and 2B, after the formation of a direct connect back side edit wire to edit the IC structure.
Figure 3B:
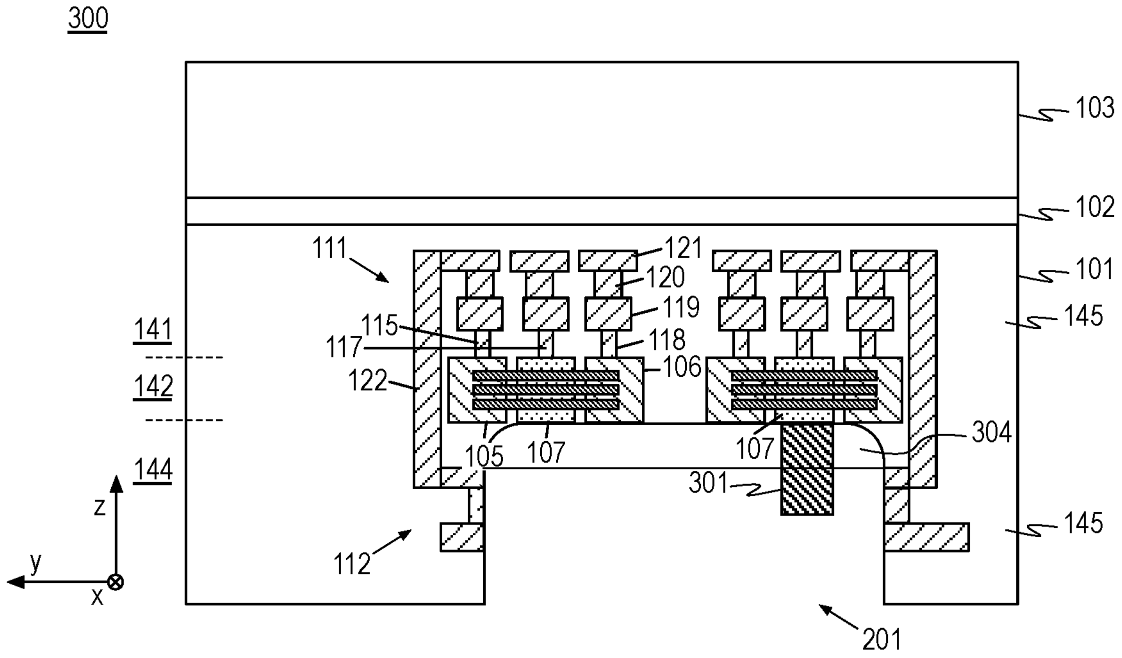
Figure 5A:
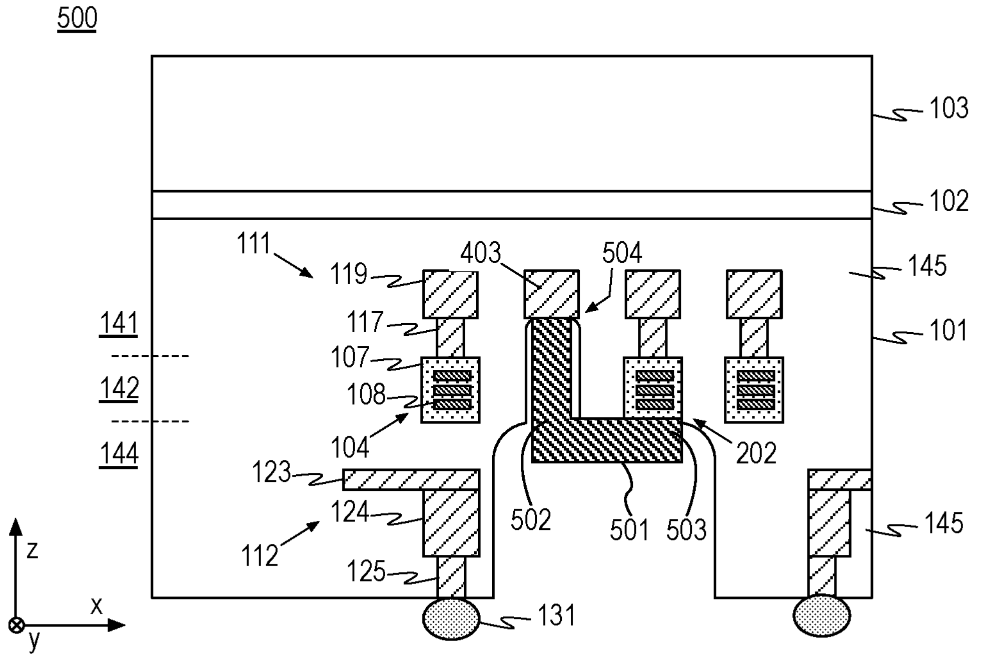
FIGS. 5A and 5B illustrate cross-sectional side views of an example IC structure similar to the IC structure of FIGS. 4A and 4B, after the formation of a direct connect back side edit wire to edit the IC structure.
Figure 5B:
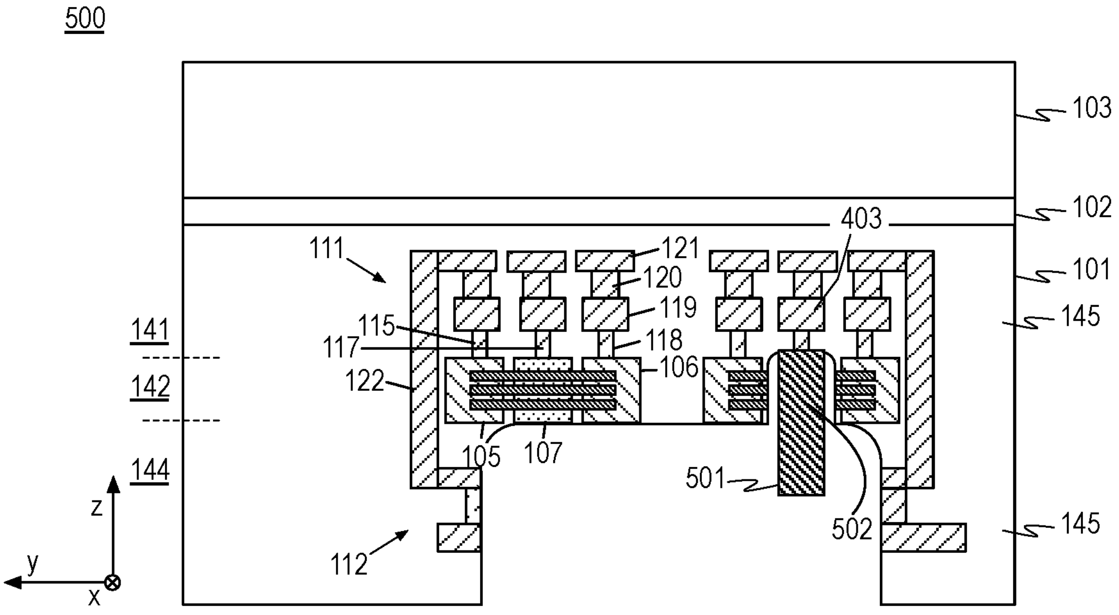

FIGS. 3A and 3B illustrate cross-sectional side views of an example IC structure 300 similar to IC structure 200, after the formation of a direct connect back side edit wire 301 to edit IC structure 300. As shown, within opening 201, an edit wire 301 is formed by direct writing such that wire 301 couples at a first end 302 to a back side surface 202 one of a source 105, a gate structure 107, or a drain 106 of one of GAA transistors 104 and a second end 303 of wire 301 couples to a back side surface 202 of another of a source 105, a gate structure 107, or a drain 106 of one of GAA transistors 104, or to another circuit structure. The other circuit structure may be a metallization feature of front side metallization layers 141 as illustrated in FIGS. 5A and 5B, a metallization feature of back side metallization layers 144, an external probe tip, or any other feature.

As shown in FIGS. 3A and 3B, in some embodiments, after the formation of openings 201, an optional dielectric material 304 (e.g., an oxide) may be formed within opening 201 such that dielectric material 304 is deposited over the exposed region of opening 201 to isolate the region from other circuit structures such as other GAA transistors 104 and metallization features 123, 124, 125. The dielectric may partially fill opening 201, as shown. Subsequent to dielectric deposition, via openings may be formed into the dielectric using any suitable technique or techniques. Wire 301 may then be formed such that first end 302 is within a first via opening and second end 303 is within another via opening. In some embodiments, dielectric material 304 is not deployed and wire 301 is formed directly on the exposed surface of opening 201. Such techniques are illustrated further herein below.

In the example of FIGS. 3A and 3B, wire 301 couples a gate structure 107 of a first GAA transistor 104 to a gate structure 107 of a second GAA transistor 104. However, wire 301 may connect at first end 302 to a back side surface 202 of any of a source 105, a gate structure 107, or a drain 106 of a GAA transistor 104. In some embodiments, first end 302 of wire 301 is in contact with a back side surface 202 of a source 105 of a first GAA transistor 104 and second end 303 of wire 301 is in contact with a back side surface 202 of a gate structure 107 of a second GAA transistor 104. In some embodiments, first end 302 of wire 301 is in contact with a back side surface 202 of a drain 106 of a first GAA transistor 104 and second end 303 of wire 301 is in contact with a back side surface 202 of a gate structure 107 of a second GAA transistor 104. In some embodiments, first end 302 of wire 301 is in contact with a back side surface 202 of a gate structure 107 of a first GAA transistor 104 and second end 303 of wire 301 is in contact with a back side surface 202 of a gate structure 107 of a second GAA transistor 104. In some embodiments, first end 302 of wire 301 is in contact with a metallization feature of front or back side metallization layers 141, 144 and second end 303 of wire 301 is in contact with a back side surface 202 of one of a source 105, drain 106, or a gate structure 107 of a second GAA transistor 104. Other routings are available and, in particular, wire 301 may connect to more than two components to provide additional electrical routing. Notably, the techniques discussed herein may be deployed in any context where back side contact is made to one of a source 105, a gate structure 107, or a drain 106 of a GAA transistor 104.

Edit wire 301 may be formed using any suitable technique or techniques. In some embodiments, wire 301 is formed using e-beam deposition (e.g., e-beam physical vapor deposition). In some embodiments, wire 301 is formed using FIB deposition such as FIB induced deposition of tungsten hexacarbonyl ($W(CO)_6$), dicobalt octacarbonyl ($Co(CO)_8$), or similar materials. In some embodiments, wire 301 is formed using direct write lithography. Herein, the term direct write deposition indicates the wire is formed in a single continuous process operation directly onto the underlying materials. For example, direct write deposition does not include bulk material deposition followed by etch patterning, trench formation and fill of the trench pattern, or the like, which include multiple operations. Such direct write deposition may also be characterized as mask-less processing.

Edit wire 301 may be formed of any suitable materials such as tungsten hexacarbonyl ($W(CO)_6$), dicobalt octacarbonyl ($Co(CO)_8$), or other conductive materials that are suitable for deposition using direct write techniques. Notably, wire 301 may have different composition and/or characteristics with respect to metallization features 123, 124, 125 of back side metallization layers 144. In some embodiments, wire 301 and metallization features 123, 124, 125 may be different metals. For example, wire 301 may be one of tungsten hexacarbonyl or dicobalt octacarbonyl ($Co(CO)_8$), and metallization features 123, 124, 125 may be copper. In some embodiments, wire 301 may have a different grain size with respect to metallization features 123, 124, 125. Furthermore, wire 301 may have different dimensions with respect to the metallization features. Although not illustrated for the sake of clarity, in some embodiments, wire 301 has a thickness in the z dimension that is less than that of metallization features 123, 124, 125. In some embodiments, wire 301 has a thickness that is not more than half of that of any of metallization features 123, 124, 125.

As discussed, edit wires 301 provide for a wide range of edit or modification options for an IC structure such that the various debug procedures may be performed. Notably, with the transition to GAA transistors 104 and use of back side metallization layers 144 (e.g., for back side power delivery and other uses, and increased need for GAA transistor 104 placement density, access for edit, test, and debug are limited. The techniques discussed herein provide such edit and test functionality from the back side for improved transistor node access with reduced machining geometries, reduced invasiveness, and other advantages.

Figure 4A:
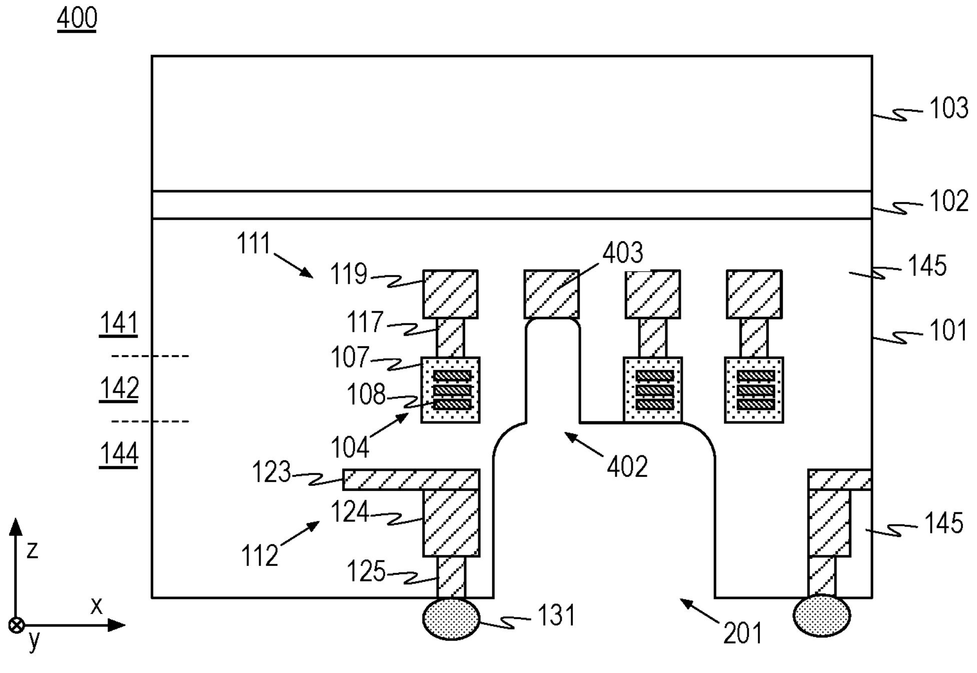
FIGS. 4A and 4B illustrate cross-sectional side views of an example IC structure similar to the IC structure of FIGS. 2A and 2B, after the removal of a portion of a device layer 142 expose a metallization feature of front side metallization layers.
Figure 4B:
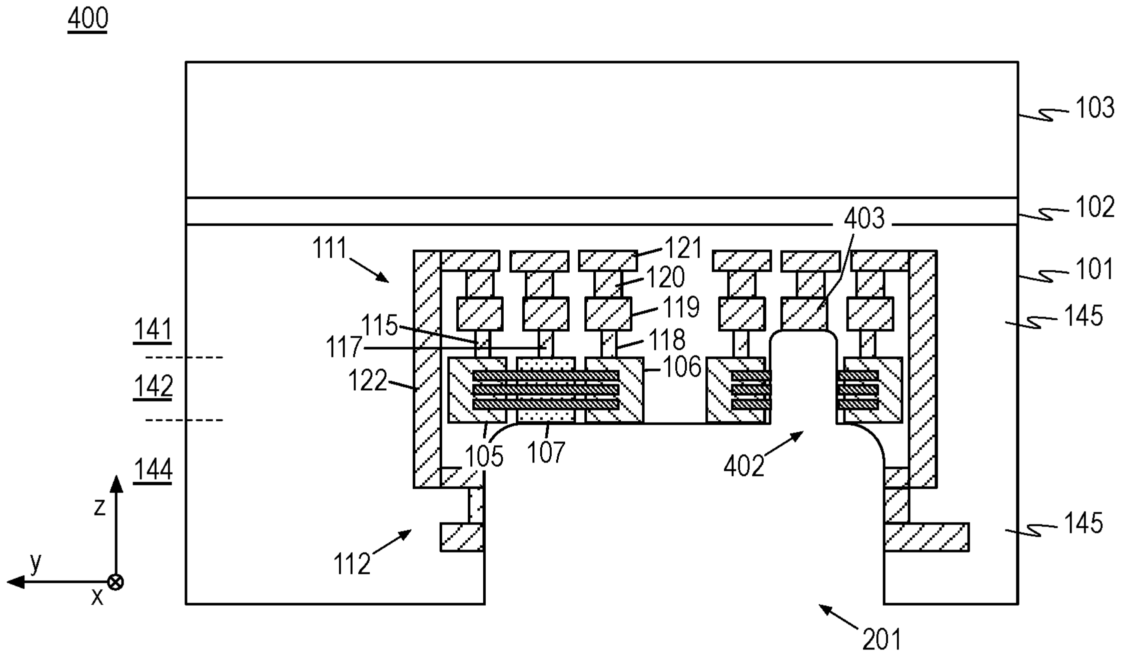

FIGS. 4A and 4B illustrate cross-sectional side views of an example IC structure 400 similar to IC structure 200, after the removal of a portion of device layer 142 to expose a metallization feature 403 of front side metallization layers 141. For example, the operations discussed with respect to FIGS. 2A, 2B, 3A, and 3B provide contact to back side surfaces 202 of any of sources 105, gate structures 107, or drains 106 of GAA transistors 104. However, in some circuit edit contexts, it may be desirable to further contact metallization features 403 of front side metallization layers 141.

As shown, portions of device layer 142 are removed to form one or more openings 402, which provide access to front side metallization layers 141. Any number of metallization features 403 of front side metallization layers 141 may be exposed in such processing. In the illustrated example, a metal line from a first metallization layer (e.g., M0) is exposed. However, any metallization features 403 inclusive of higher level metal lines or metal vias of front side metallization layers 141 may be exposed. Openings 201 may be formed by removal of portions of device layer 142 using any suitable technique or techniques. In some embodiments, the portions of device layer 142 are removed using one or more of patterning and etch techniques, physical machining, electrochemical machining, FIB machining, FIB ablation, or laser ablation.

FIGS. 5A and 5B illustrate cross-sectional side views of an example IC structure 500 similar to IC structure 400, after the formation of a direct connect back side edit wire 501 to edit IC structure 500. As shown, within openings 201, 402, edit wire 501 is formed by direct writing such that wire 501 couples at a first end 502 to a back side surface 504 of metallization feature 403 and a second end 503 of wire 501 couples to back side surface 202 of one of a source 105, a gate structure 107, or a drain 106 of one of GAA transistors 104. As discussed with respect to FIGS. 3A and 3B, in some embodiments, after the formation of openings 201, 402, an optional dielectric material may be formed and vias may be formed therein prior to forming wire 501. Such techniques may also be used in the context of FIGS. 5A and 5B.

In the example of FIGS. 5A and 5B, wire 501 couples a gate structure 107 of a GAA transistor 104 to metallization feature 403. However, wire 501 may connect metallization feature 403 to any of a source 105, a gate structure 107, or a drain 106 of a GAA transistor 104. Furthermore, wire 501 may connect additional ones of metallization features 403 and/or sources 105, gate structures 107, or drains 106 of GAA transistors 104 in any combination as needed for the circuit edit being implemented.

Edit wire 501 may be formed using any suitable technique or techniques discussed herein above such as e-beam deposition, FIB deposition, or direct write lithography. Furthermore, edit wire 501 may have any characteristics or features discussed with respect to edit wire 301. The techniques discussed with respect to FIGS. 4A, 4B, 5A, and 5B offer additional flexibility in the back side access and editing of GAA transistors 104. In particular, such connections may offer the ability to provide inter cell bypasses of multiple transistor cells or blocks.

Discussion now turns to exemplary circuit edits that may be made using the techniques discussed herein. Notably, such edits may be made using the techniques discussed with respect to any of FIGS. 1A, 1B, 2A, 2B, 3A, 3B, 5A, 4B, 5A, 5B, 8A, 8B, 9A, 9B, 10A, 10B, 11A, 11B, 12A, 12B, 13A, 13B, 14A, and 14B.

Figure 6A:
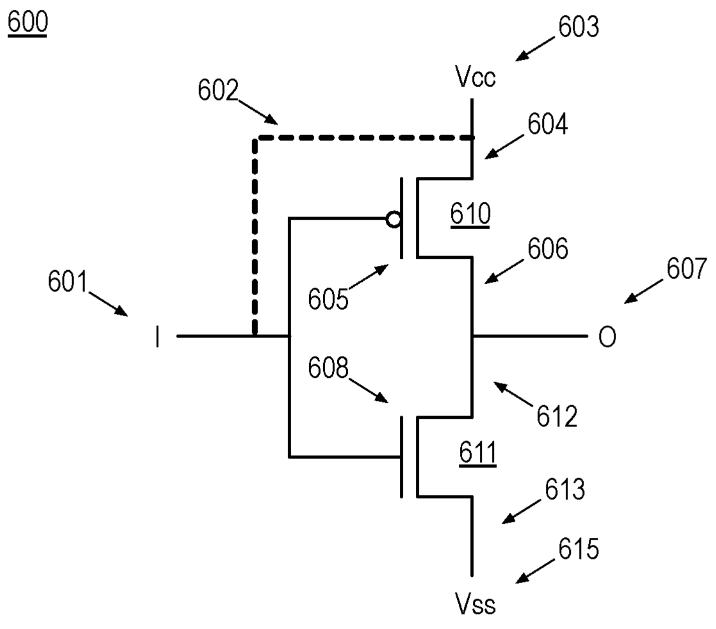
FIGS. 6A and 6B illustrate schematic diagrams of example circuit blocks having exemplary circuit edits.
Figure 6B:
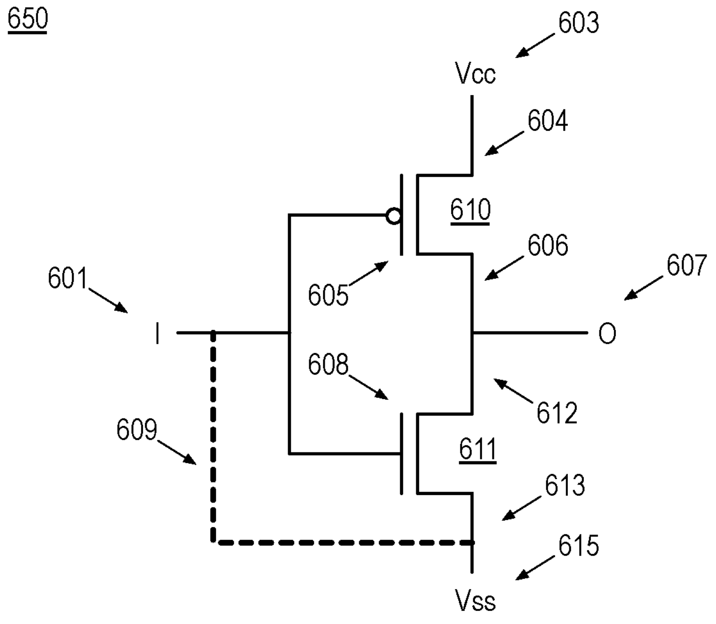

FIGS. 6A and 6B illustrate schematic diagrams of example circuit blocks 600, 650 having exemplary circuit edits 602, 609, arranged in accordance with at least some implementations of the present disclosure. For example, circuit edits 602, 609 may be provided using any edit wires discussed herein. As shown, circuit blocks 600, 650 include GAA transistors 610, 611. GAA transistor 610 includes a gate 605, a source or a drain 604 coupled to Vcc 603 (i.e., a power supply), and another of a source or a drain 606 coupled to an output 607. GAA transistor 611 includes a gate 608, a source or a drain 613 coupled to Vss 615 (i.e., a lower power supply or a ground), and another of a source or a drain 612 coupled to output 607. Furthermore, circuit blocks 600, 650 include an input 601 coupled to both of gates 605, 608. For example, circuit blocks 600, 650 may be deployed in any IC structure herein.

As shown, one of circuit edits 602, 609 may be applied as discussed herein for the sake of circuit edit for test and evaluation. In this example, circuit edit 602 as shown in FIG. 6A, which may be characterized as a tie-high edit, couples one or both of gates 605, 608 to source or drain 604 and thereby to Vcc 603. Similarly, circuit edit 609 as shown in FIG. 6B, which may be characterized as a tie-low edit, couples one or both of gates 605, 608 to source or drain 604 and thereby to Vss 615. Such circuit edits 602, 609 may be provided using the techniques discussed herein, for example, by coupling a gate structure 107 to a source 105 or a drain 106. As discussed, edit wire techniques may be used to provide a variety of edits with circuit edits 602, 609 being exemplary.

Figure 7:
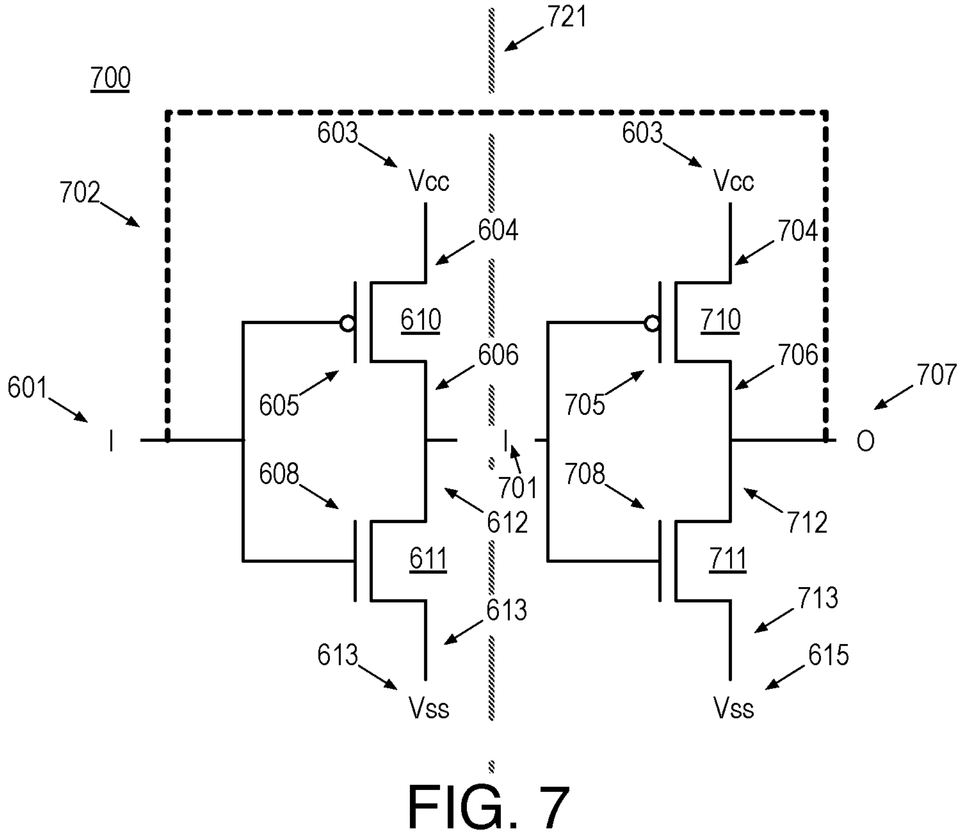
FIG. 7 illustrates a schematic diagram of an example multi-cell circuit block having an exemplary circuit edit.

FIG. 7 illustrates a schematic diagram of an example multi-cell circuit block 700 having an exemplary circuit edit 702, arranged in accordance with at least some implementations of the present disclosure. For example, circuit edit 702 may be provided using edit wire 501 as discussed herein. As shown, multi-cell circuit block 700 includes GAA transistors 610, 611, 710, 711. GAA transistor 710 is similar to GAA transistor 610 and includes a gate 705 and a source or a drain 704 coupled to Vcc 603 and another of a source or a drain 706 coupled to an output 707. GAA transistor 711 is similar to GAA transistor 611 and includes a gate 708, a source or a drain 713 coupled to Vss 615 (i.e., a lower power supply or a ground), and another of a source or drain 712 coupled to output 707. Furthermore, circuit block 700 includes an input 701 coupled to both of gates 705, 708. In some embodiments, GAA transistors 610, 611 and GAA transistors 710, 711 are implemented in separate cells that are separated by a cell boundary 721. Multi-cell circuit block 700 may be deployed in any IC structure herein.

As shown, circuit edit 702 may be applied as discussed herein for the sake of circuit edit for test and evaluation. In this example, circuit edit 702, which may be characterized as an inter cell bypass, couples one or both of gates 605, 608 to output 707. In some embodiments, contact to output 707 is made via connection to metallization feature 403. For example, metallization feature 403 may be a low level metal line (M0) carrying the signal of output 707. As shown, circuit edit 702 bypasses cell boundary 721. Such circuit edit 702 may be provided using the techniques discussed herein.

Discussion now turns to deployment of back side probe points that are formed on back side surfaces of sources 105, gate structures 107, and drains 106. Such back side probe points may be exposed and accessed for purposes of test (i.e., contact by a probe pin or e-beam of an e-beam prober) and/or circuit edit. For example, circuit edits 602, 609, 702 or other edits of IC structures may be deployed using such back side probe points.

Figure 8A:
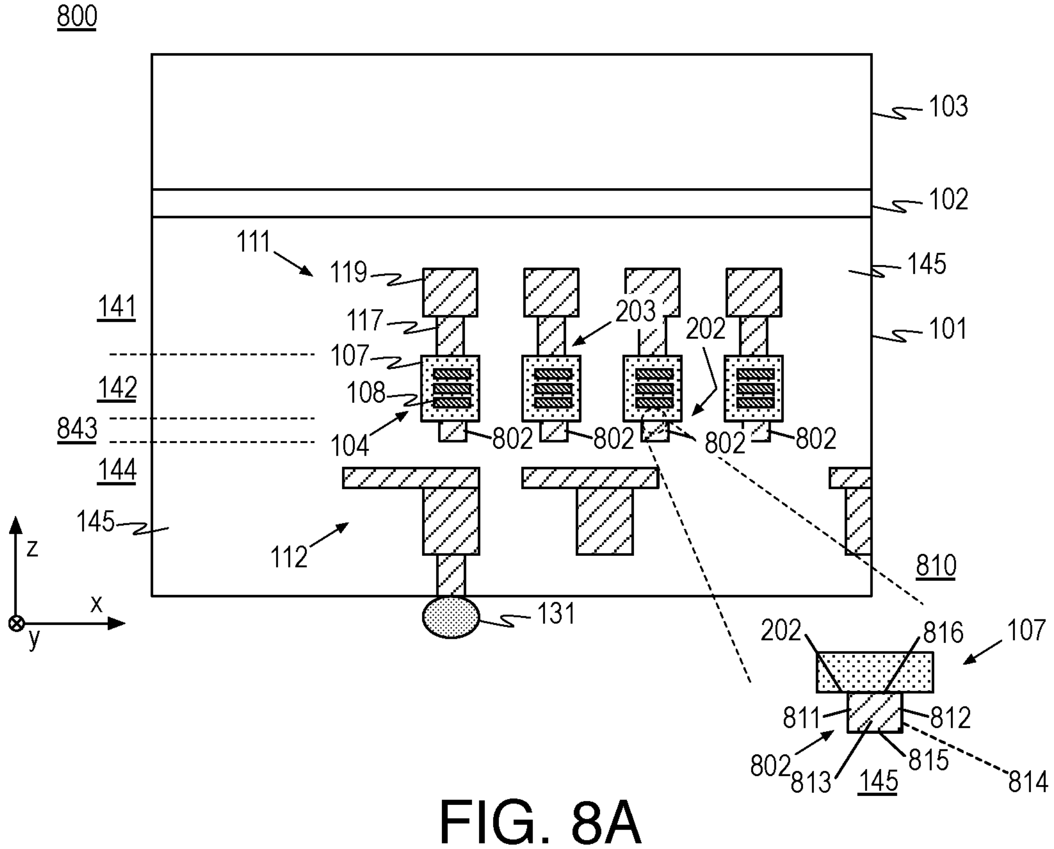
FIGS. 8A and 8B illustrate cross-sectional side views of an example integrated circuit structure including a number of gate-all-around transistors contacted by back side probe point structures.
Figure 8B:
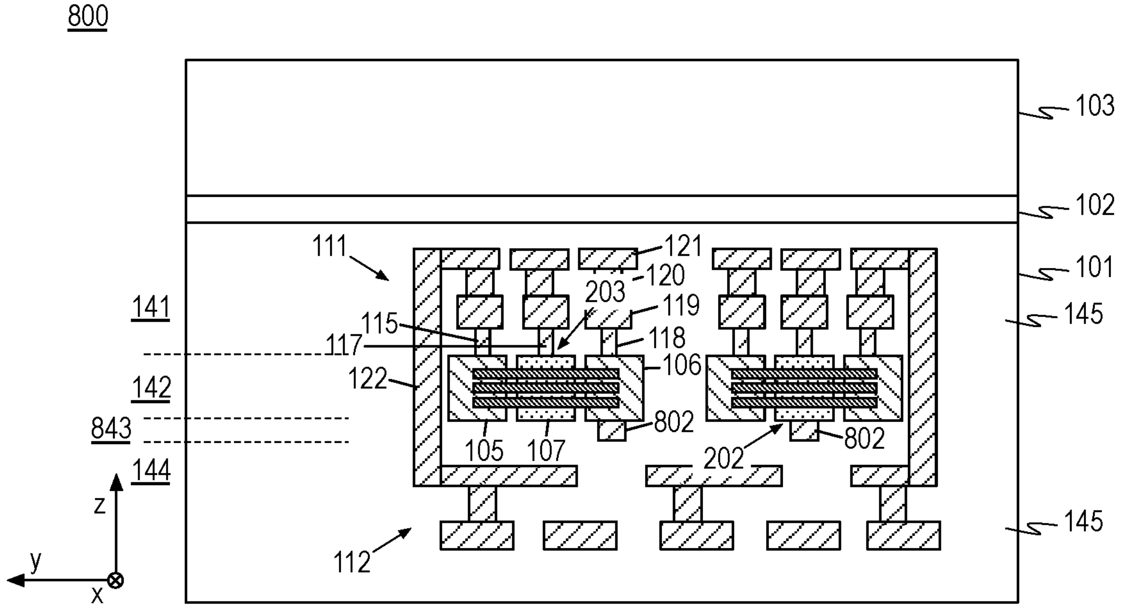

FIGS. 8A and 8B illustrate cross-sectional side views of an example integrated circuit structure 800 including a number of gate-all-around transistors 104 contacted by back side probe point structures 802, arranged in accordance with at least some implementations of the present disclosure. FIGS. 8A and 8B continue the exemplary gate cut and channel cut views, respectively, discussed above. Furthermore, in FIGS. 8A and 8B and elsewhere herein, like numerals are used to indicate like components, and such components may share any characteristics or features discussed herein.

As shown in FIGS. 8A and 8B, IC structure 800 includes IC device 101 coupled to carrier 103 by adhesion layer 102. IC device 101 includes GAA transistors 104 in device layer 142, each GAA transistor 104 having a source 105, gate structure 107, and drain 106 as discussed herein above. IC device 101 further includes front and back side metallization layers 141, 144. Between device layer 142 and back side metallization layers 144, an intervening probe point layer 843 is provided. For example, after formation of front side metallization layers 141, the work piece substrate may be coupled to carrier 103 by adhesion layer 102, and the substrate material or a majority of the substrate material may then be removed from the back side.

In some embodiments, probe point structures 802 may then be formed on back side surfaces 202 of GAA transistors 104. That is, probe point structures 802 are directly on back side surfaces 202 of sources 105, gate structures 107, and drains 106. Probe point structures 802 may be formed using any suitable technique or techniques known in the art such as blanket metal deposition followed by patterning or damascene processing inclusive of patterning openings in a dielectric layer, depositing metal in the openings, and planarization of the metal. Other processes may be used. Such probe point structures 802 may include any suitable conductive material such as aluminum, tungsten, copper, or other metals. After formation of probe point structures 802 and optional direct write wiring, back side metallization layers 144 and interconnects 131 are formed. Although illustrated as one level of metal, in some embodiments, probe point structures 802 may include other metal levels fabricated during formation of back side metallization layers 144. For example, probe point structures 802 may include multiple metal layers interconnected through vias and/or metal lines of back side metallization layers 144.

In some embodiments, probe point structures 802 are fabricated during front end processing. For example, a patterned layer of metal inclusive of probe point structures 802 may fabricated during front end processing prior to fabrication of GAA transistors 104. GAA transistors 104 may then be fabricated such that components of GAA transistors 104 are on the patterned probe point structures 802. Processing would then continue with fabrication of front side metallization layers 141, attachment to carrier 103, back side reveal, and fabrication of back side metallization layers 144.

Notably, probe point structures 802 provide a dedicated conductive probe and node access point directly on back side surfaces 202 of the components of GAA transistors 104. This provides access to GAA transistors 104 of device layer 142 for probing and/or circuit editing or rerouting purposes. Probe point structures 802 advantageously direct contact into the components of GAA transistors 104 (i.e., GAA transistor 104 input and output). Furthermore, by deploying probe point structures 802, probing and circuit editing connections may be made without risk of damaging the components of GAA transistors 104 (in particular, the device channel structures 108) with a probe tip, electron beam, or ion beam, which can otherwise cause undesirable dislocations, charge trapping, and other problems.

As discussed, components of GAA transistors 104 are contacted from a front side by source contact 115, gate contact 117, and drain contact 118 of front side metallization layers 141, and further layers of metallization of front side metallization layers 141 inclusive metallization features 119, 120, 121, and so on, are used to provide signal and power routing 111. Back side metallization layers 144 are used to provide signal and power routing 112 and front and back side metallization layers 144 may be interconnected by vias 122.

As shown in expanded view 810, each of probe point structures 802, when not contacted by an edit wire, has a number of surfaces, one of which is in contact with a source 105, a gate structure 107, or a drain 106, and the remainder of which are embedded in dielectric materials 145. In the illustrated example, probe point structures 802 is a rectangular prism or cube. However, other shapes may be used. In the illustrated example, probe point structures 802 has surfaces inclusive of side surfaces 811, 812 (i.e., surfaces in the y-z plane), front and back surfaces 813, 814 (i.e., surfaces in the x-z plane), and top and bottom surfaces 816, 815 (i.e., surfaces in the x-y plane). Notably, top surface 816 is on and in direct contact with back side surface 202 of source 105, gate structure 107, or drain 106 (with gate structure 107 being illustrated) while every other surface 811, 812, 813, 814, 815 is in direct contact with the one or more dielectric materials of dielectric materials 145 (which may also be characterized as isolation or isolation materials). As discussed, probe point structures 802 may have any suitable shape. However, in any such shape, one surface is in direct contact with back side surface 202 of source 105, gate structure 107, or drain 106 while all other surfaces are in direct contact with the one or more dielectric materials of dielectric materials 145. Thereby, probe point structures 802 are electrically isolated until contacted by a direct write wiring, if needed.

Figure 9A:
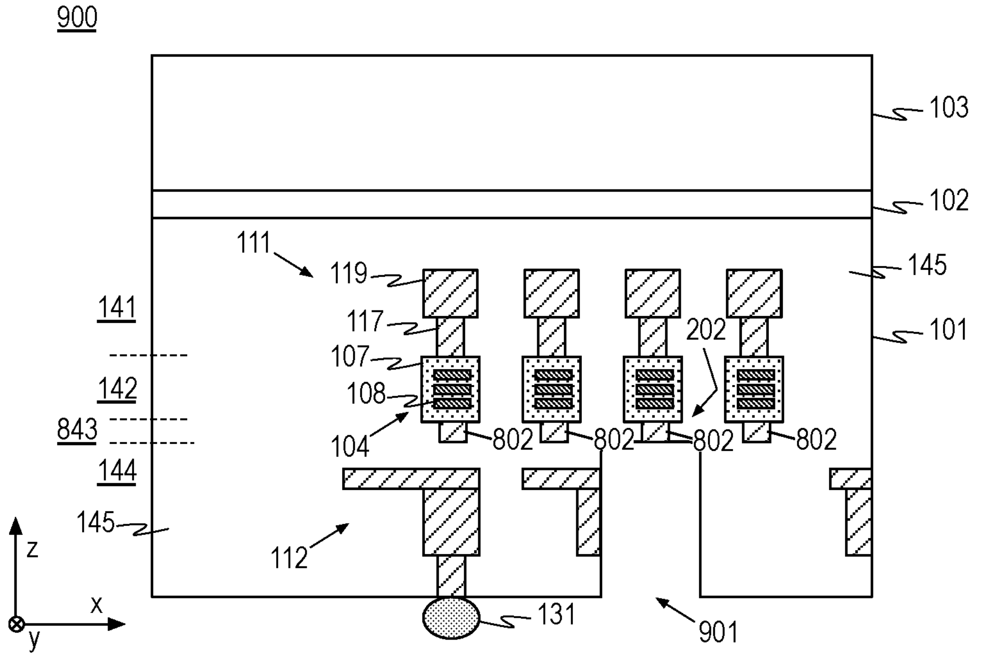
FIGS. 9A and 9B illustrate cross-sectional side views of an example IC structure similar to the IC structure of FIGS. 8A and 8B, after the removal of a portion of back side metallization layers to expose probe point structures.
Figure 9B:
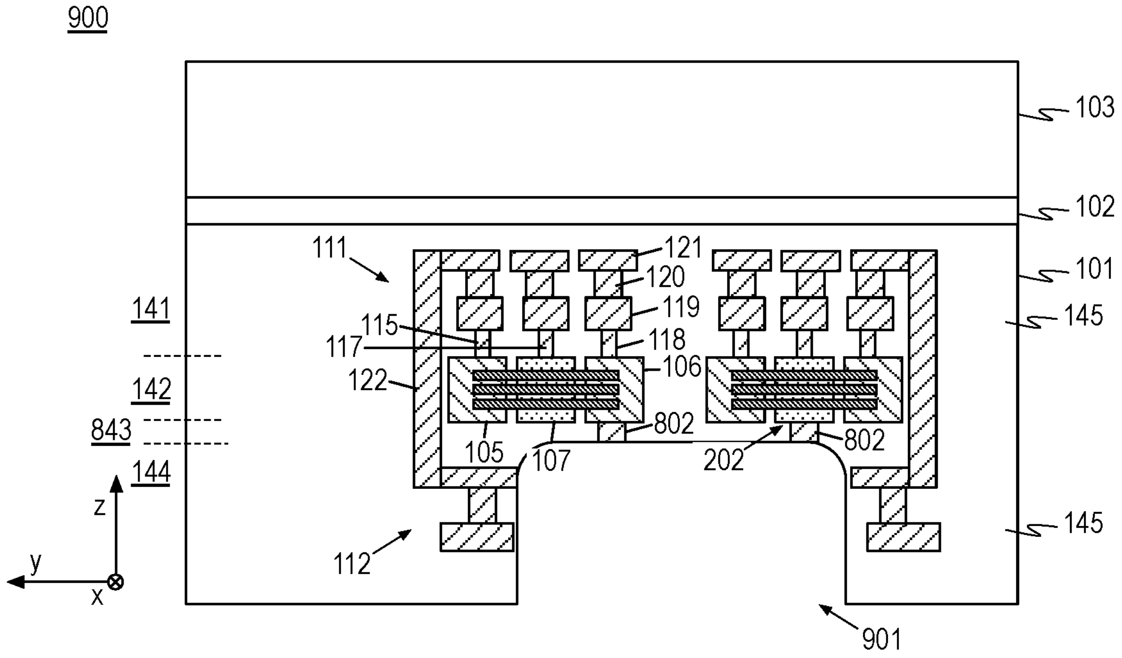

FIGS. 9A and 9B illustrate cross-sectional side views of an example IC structure 900 similar to IC structure 800, after the removal of a portion of back side metallization layers 144 to expose probe point structures 802. It is noted the operations described with respect to FIGS. 9A, 9B, 10A, 10B, 11A, and 11C discuss contexts where probe point structures 802 are accessed after the fabrication of back side metallization layers 144. Probe point structures 802 may also be used prior to the fabrication of back side metallization layers 144, as discussed with respect to FIGS. 13A, 13B, 14A, and 14B.

As shown, portions of back side metallization layers 144 are removed to form one or more openings 901, which provide access to probe point structures 802, which are in contact with back side surfaces 202 of GAA transistors 104. Any number of probe point structures 802 may be exposed to provide access to the components of GAA transistors 104. For example, openings 901 may be patterned to expose desired ones of probe point structures 802 corresponding to those sources 105, gate structures 107, and drains 106 that need to be probed and/or coupled to a wire. Openings 901 may also expose as other circuit features, as needed. Openings 901 may be formed by removal of back side metallization layers 144 using any suitable technique or techniques such as one or more of patterning and etch techniques, physical machining, electrochemical machining, FIB machining or ablation, or laser ablation techniques. In addition, techniques discussed with respect to FIGS. 4A and 4B may be performed when contact is desired to front side metallization layers 141 for probing and/or coupling to an edit wire.

Figure 10A:
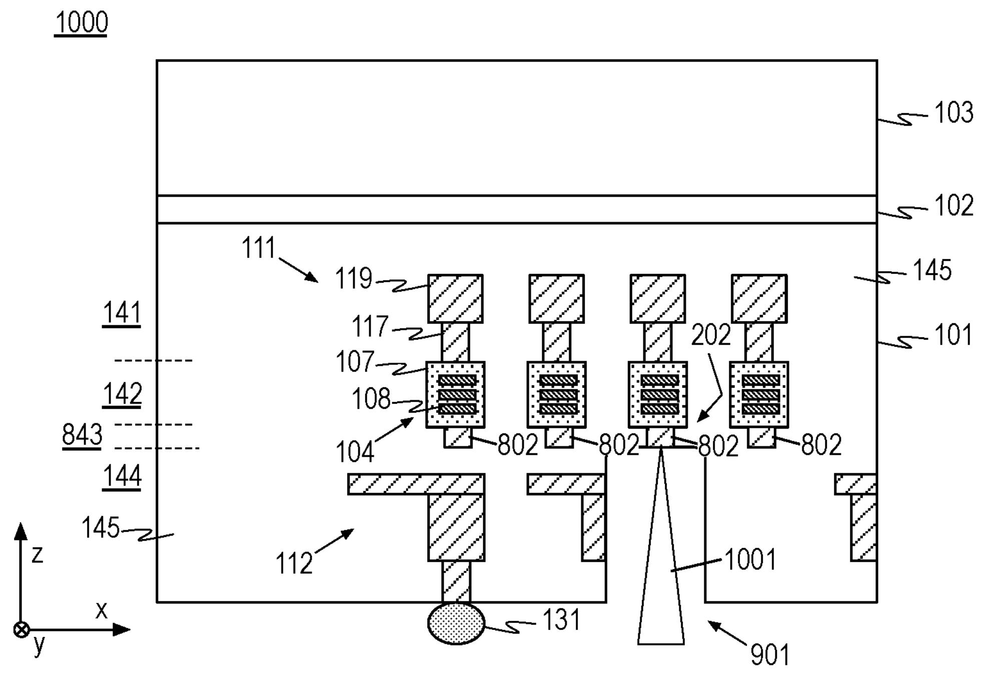
FIGS. 10A and 10B illustrate cross-sectional side views of an example IC structure similar to the IC structure of FIGS. 9A and 9B, during probing of the IC structure.
Figure 10B:
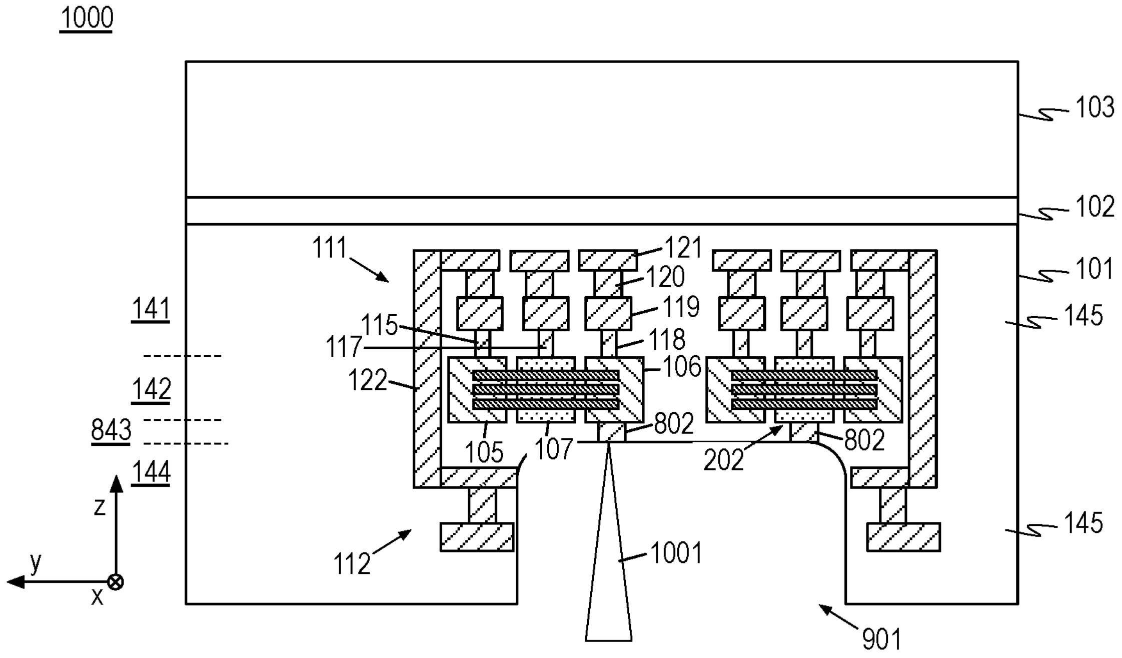

FIGS. 10A and 10B illustrate cross-sectional side views of an example IC structure 1000 similar to IC structure 900, during probing of IC structure 1000. As shown, select one or more of probe point structures 802 are contacted by a probe 1001. Probe 1001 may be any suitable probe structure such as an electron beam, an ion beam, or a mechanical probe for electrical testing. Probe 1001 may perform any suitable testing such as one or more of electrical signal testing, e-beam testing, ion beam testing, or the like.

Advantageously, probe point structures 802 provide probe points that protect sources 105, gate structures 107, and drains 106 of GAA transistors 104 during test. By protecting such components during test, the testing provides more reliable test data as, without protection, damage to GAA transistors 104 can provide undesirable and unpredictable shifts in test results. In particular, ion beam testing may cause implant into the components of GAA transistors that can cause device damage. Thereby, probe point structures 802 provide additional features for improved test accessibility of GAA transistors 104. Such improvements allows for improved flexibility and granularity of the testing inclusive of accurate testing of logic states inclusive of fixed logic states and temporally changing logic states.

Discussion now turns to using exposed probe point structures for circuit editing.

Figure 11A:
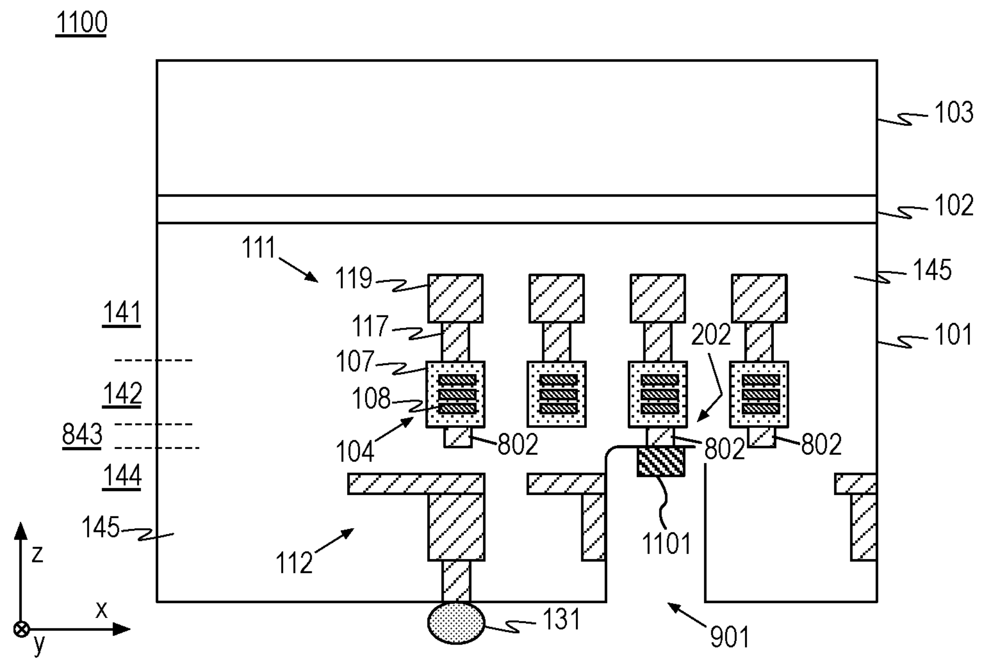
FIGS. 11A and 11B illustrate cross-sectional side views of an example IC structure similar to the IC structure of FIGS. 9A and 9B, after the formation of a direct connect back side edit wire to edit the IC structure.
Figure 11B:
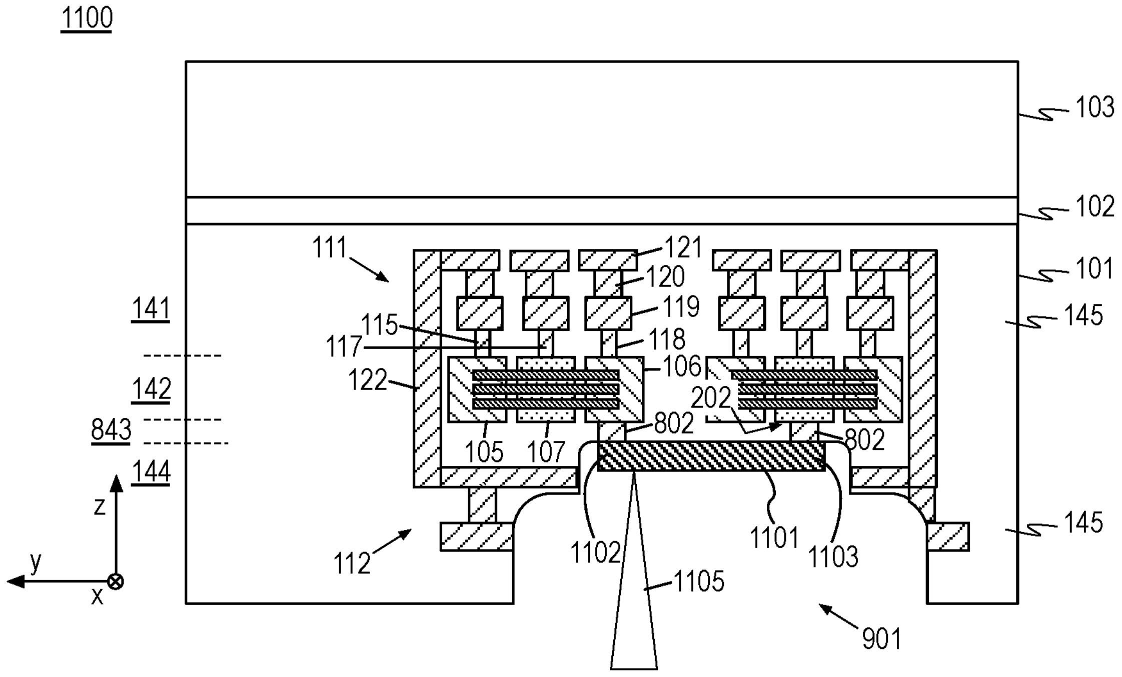

FIGS. 11A and 11B illustrate cross-sectional side views of an example IC structure 1100 similar to IC structure 900, after the formation of a direct connect back side edit wire 1101 to edit IC structure 1100. As shown, within opening 901, an edit wire 1101 is formed by direct writing 1105 such that wire 1101 couples at a first end 1102 to a probe point structure 802 on a back side surface 202 one of a source 105, a gate structure 107, or a drain 106 of one of GAA transistors 104 and a second end 1103 of wire 1101 couples to a probe point structure 802 on a back side surface 202 of another of a source 105, a gate structure 107, or a drain 106 of one of GAA transistors 104, or to another circuit structure. The other circuit structure may be a metallization feature of front side metallization layers 141 as illustrated in FIGS. 5A and 5B, a metallization feature of back side metallization layers 144, an external probe tip, or any other feature.

As shown in FIGS. 11A and 11B, in some embodiments, edit wire 1101 is fabricated directly on exposed surfaces of opening 901. In other embodiments, as discussed with respect to FIGS. 3A and 3B, after the formation of opening 901, an optional dielectric material may be formed within opening 901, via openings may be formed in the dielectric to expose the desired probe point structures 802, and edit wire 1101 may be formed on the dielectric material and within the vias.

In the example of FIGS. 11A and 11B, wire 1101 couples to a probe point structure 802 on a drain 106 of a first GAA transistor 104 and to a probe point structure 802 on a gate structure 107 of a second GAA transistor 104. However, wire 1101 may connect to a probe point structure 802 that is on any of a source 105, a gate structure 107, or a drain 106 of a GAA transistors 104. In some embodiments, first end 1102 of wire 1101 is in contact with a probe point structure 802 on a source 105 of a first GAA transistor 104 and second end 1103 of wire 1101 is in contact with a probe point structure 802 on a gate structure 107 of a second GAA transistor 104. In some embodiments, first end 1102 of wire 1101 is in contact a probe point structure 802 on a drain 106 of a first GAA transistor 104 and second end 1103 of wire 1101 is in contact with a probe point structure 802 on a gate structure 107 of a second GAA transistor 104. In some embodiments, first end 1102 of wire 1101 is in contact with a probe point structure 802 on a gate structure 107 of a first GAA transistor 104 and second end 1103 of wire 1101 is in contact with a probe point structure 802 on a gate structure 107 of a second GAA transistor 104. In some embodiments, first end 1102 of wire 1101 is in contact with a metallization feature of front or back side metallization layers 141, 144 and second end 1103 of wire 1101 is in contact with a probe point structure 802 on one of a source 105, drain 106, or a gate structure 107 of a second GAA transistor 104. Other routings are available and wire 1101 may connect to more than two components to provide additional electrical routing. For example, wire 1101 may provide any wiring or circuit editing discussed herein such as those discussed with respect to FIGS. 5A, 5B, 6, and 7.

Edit wire 1101 may be formed using any suitable technique or techniques discussed herein such as e-beam deposition, FIB deposition, direct write lithography, or the like. Similarly, edit wire 1101 may be formed of any suitable materials discussed herein such as tungsten hexacarbonyl ($W(CO)_6$), dicobalt octacarbonyl ($Co(CO)_8$), or similar conductive materials that are suitable for deposition using direct write techniques.

Discussion now turns to formation of edit wires prior to fabrication of back side metallization. Such processing is illustrated in the context of probe point structures being deployed; however, direct contact edit lines may also be used in the context of subsequent back side metallization fabrication.

Figure 12A:
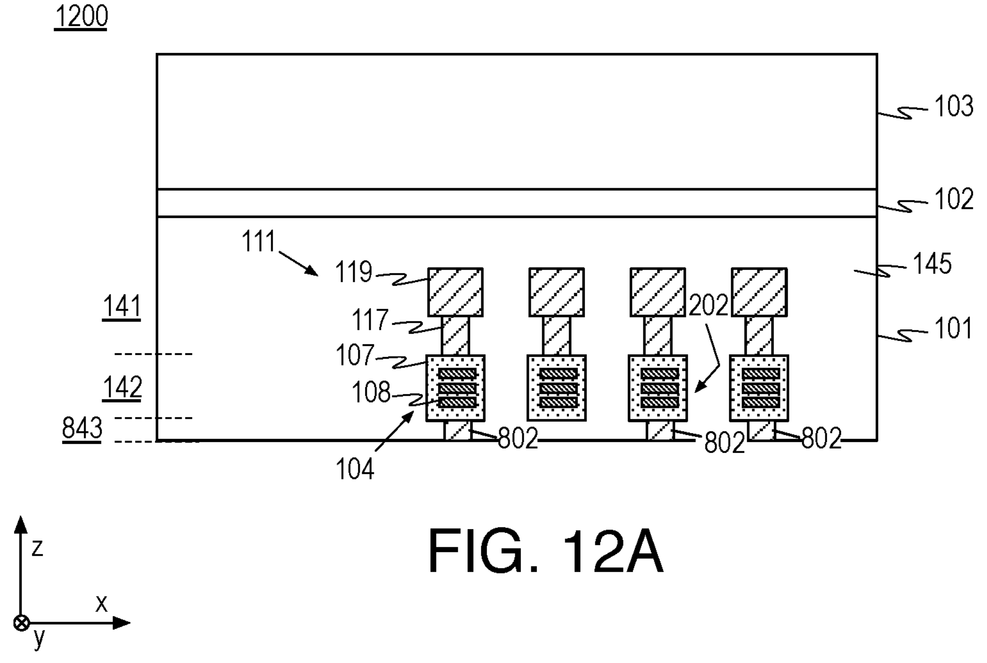
FIGS. 12A and 12B illustrate cross-sectional side views of an example integrated circuit structure including a number of gate-all-around transistors contacted by back side probe point structures prior to back side metallization.
Figure 12B:
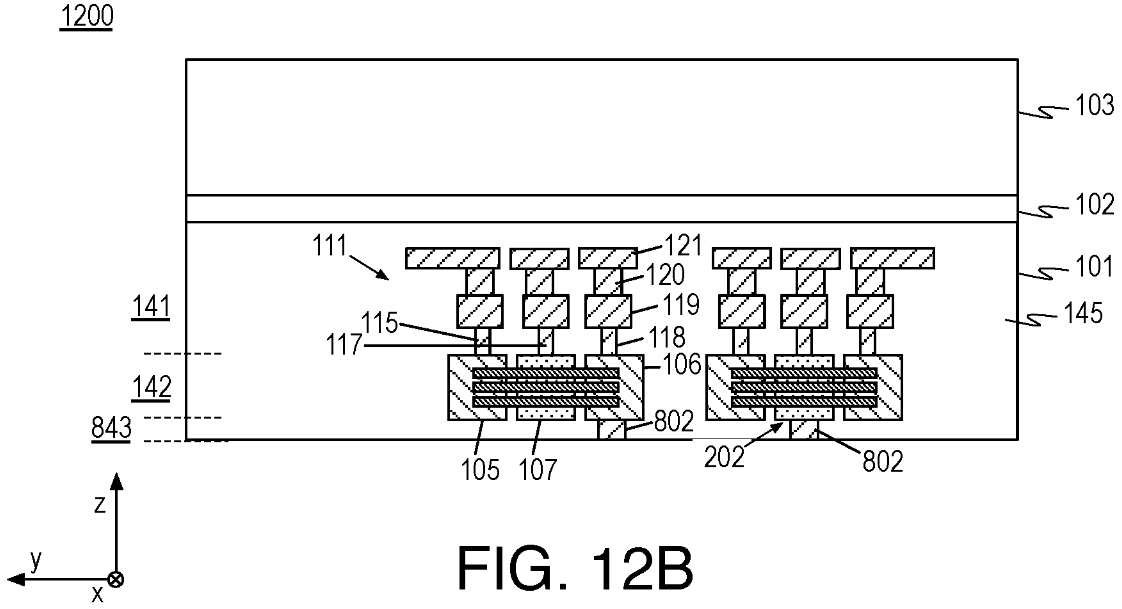

FIGS. 12A and 12B illustrate cross-sectional side views of an example integrated circuit structure 1200 including a number of gate-all-around transistors 104 contacted by back side probe point structures 802 prior to back side metallization, arranged in accordance with at least some implementations of the present disclosure. FIGS. 12A and 12B continue the exemplary gate cut and channel cut views, respectively, discussed above. As shown in FIGS. 12A and 12B, IC structure 1200 includes IC device 101 coupled to carrier 103 by adhesion layer 102. IC device 101 includes GAA transistors 104 in device layer 142, each having a source 105, gate structure 107, and drain 106, front side metallization layers 141, and probe point layer 843. For example, after formation of front side metallization layers 141, the work piece substrate may be coupled to carrier 103 by adhesion layer 102, and the substrate material or a majority of the substrate material may then be removed from the back side. Subsequently, probe point structures 802 are formed on back side surfaces 202 of GAA transistors 104. That is, probe point structures 802 are formed directly on back side surfaces 202 of sources 105, gate structures 107, and drains 106. As discussed above, probe point structures 802 may be formed using any suitable technique or techniques such as blanket metal deposition followed by patterning, damascene processing or others.

Notably, IC structure 1200 may be an in-process IC structure or work piece. As shown, probe point structures 802 are directly on back side surfaces 202 of the components of GAA transistors 104, and probe point structures 802 are exposed from dielectric materials 145. This provides access to GAA transistors 104 of device layer 142 for probing and/or circuit editing or rerouting purposes. In some embodiments, probe point structures 802 are used to probe IC structure 1200 as discussed with respect to FIGS. 10A and 10B. In some embodiments, probe point structures 802 are contacted by an edit wire prior to fabrication of back side metallization layers 144.

Figure 13A:
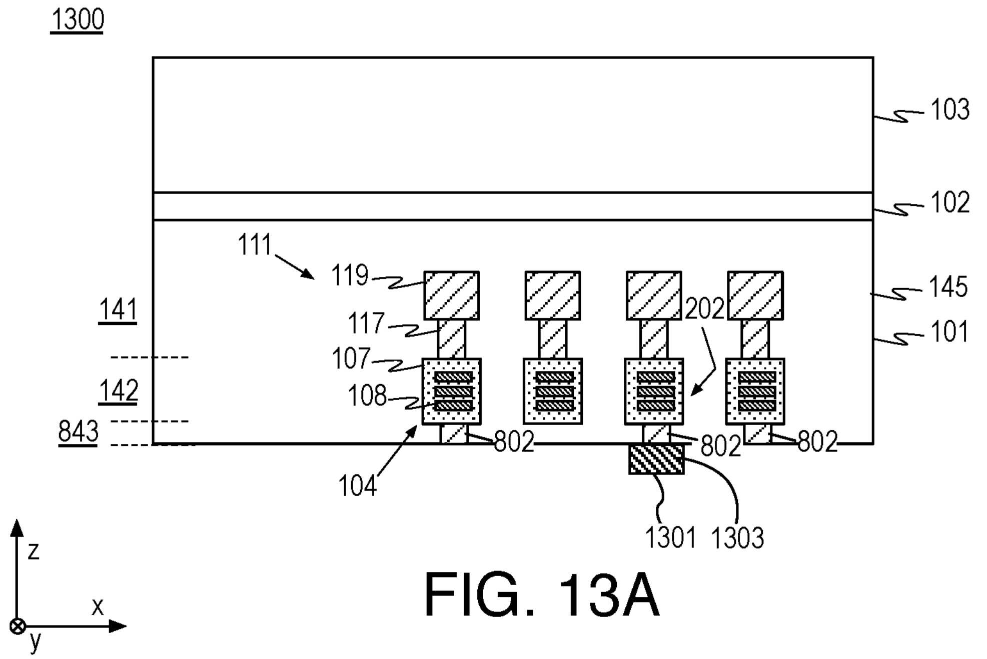
FIGS. 13A and 13B illustrate cross-sectional side views of an example IC structure similar to the IC structure of FIGS. 12A and 12B, after the formation of a direct connect back side edit wire to edit the IC structure.
Figure 13B:
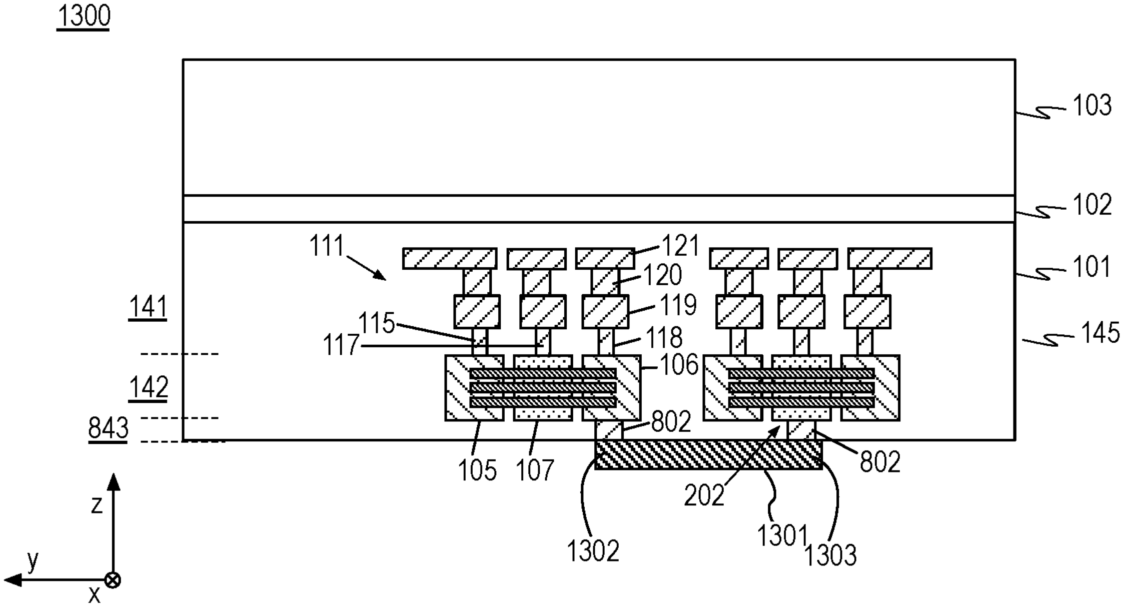

FIGS. 13A and 13B illustrate cross-sectional side views of an example IC structure 1300 similar to IC structure 1200, after the formation of a direct connect back side edit wire 1301 to edit IC structure 1300. As shown, an edit wire 1301 is formed by direct writing such that wire 1301 couples at a first end 1302 to a probe point structure 802 on a back side surface 202 one of a source 105, a gate structure 107, or a drain 106 of one of GAA transistors 104 and a second end 1303 of wire 1101 couples to a probe point structure 802 on a back side surface 202 of another of a source 105, a gate structure 107, or a drain 106 of one of GAA transistors 104.

Edit wire 1301 is fabricated directly on probe point structures 802 and exposed dielectric material surfaces of opening 901. In the example of FIGS. 13A and 13B, wire 1301 couples to a probe point structure 802 on a drain 106 of a first GAA transistor 104 and to a probe point structure 802 on a gate structure 107 of a second GAA transistor 104, as in FIGS. 11A and 11B. However, wire 1301 may connect to any probe point structures 802 as discussed herein. Edit wire 1301 may be formed using techniques discussed herein such as e-beam deposition, FIB deposition, direct write lithography, or the like. Similarly, edit wire 1301 may be formed of any suitable materials discussed herein such as tungsten hexacarbonyl ($W(CO)_6$), dicobalt octacarbonyl ($Co(CO)_8$), or similar conductive materials that are suitable for deposition using direct write techniques.

Figure 14A:
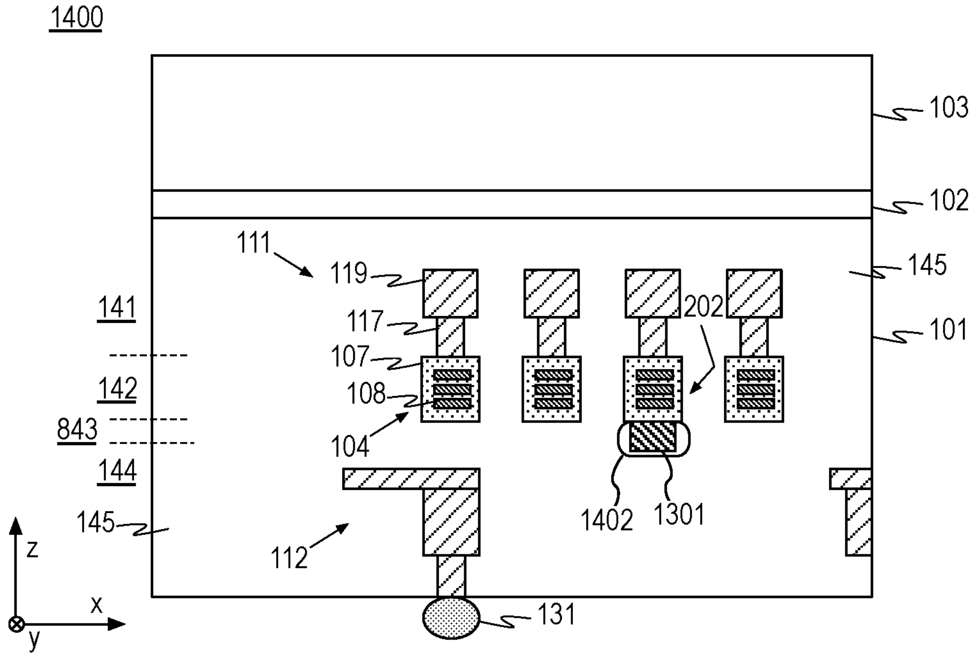
FIGS. 14A and 14B illustrate cross-sectional side views of an example IC structure similar to the IC structure of FIGS. 13A and 13B, after the formation of back side metallization layers subsequent to formation of the edit wire.
Figure 14B:
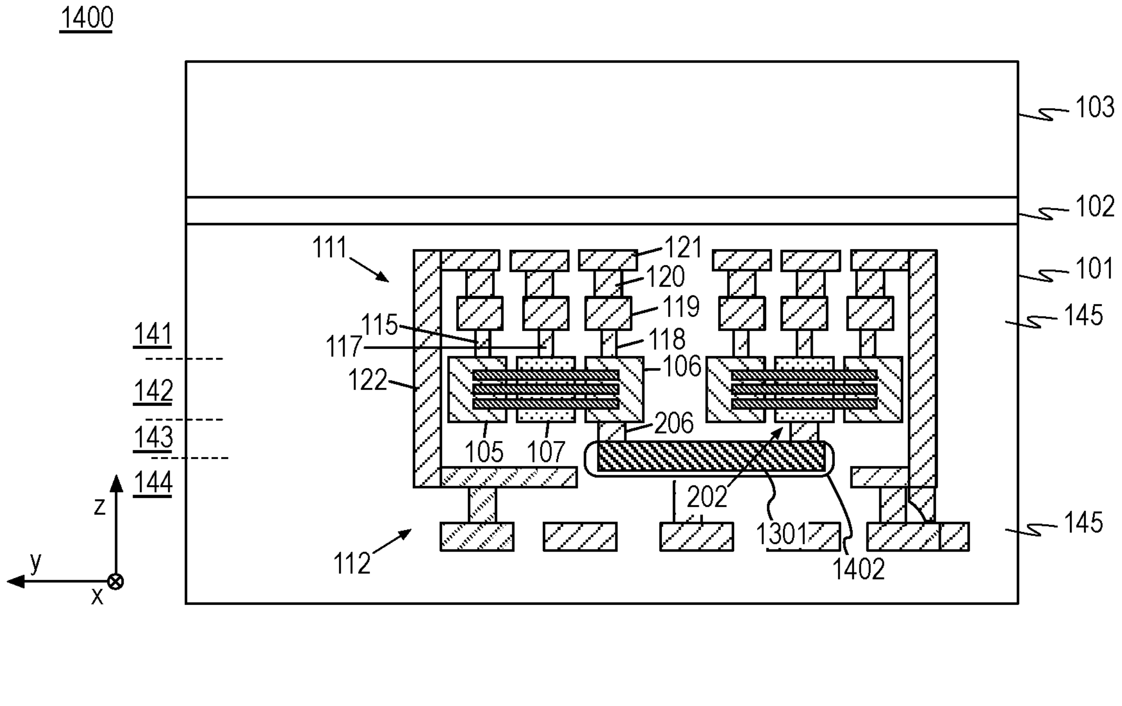

FIGS. 14A and 14B illustrate cross-sectional side views of an example IC structure 1400 similar to IC structure 1300, after the formation of back side metallization layers 144 subsequent to formation of edit wire 1301. Subsequent to the formation of edit wire 1301 and optional testing, back side metallization layers 144 and interconnects 131 are formed such that back side metallization layers 144 are embedded within dielectric materials 145. Back side metallization layers 144 may be formed using any suitable technique or techniques such as dual damascene techniques, single damascene techniques, subtractive metallization patterning techniques, or the like. In some embodiments, a void 1402 may be formed around edit wire 1301. However, in other embodiments, dielectric materials 145 are formed directly on edit wire 1301.

Discussion now returns to exposure, from the back side, of components of GAA transistors 104 and/or probe point structures 802. Notably, such back side processing to reveal components of GAA transistors 104 and/or probe point structures 802 may be performed at any point in device fabrication and packaging inclusive of at the wafer level, at die or die stack level, or at the package level of processing. For example, fabrication and packaging of a device may progress from wafer level processing to fabricate multiple dies on a wafer, to die level processing after the die has been diced from the wafer and optionally has been placed in a die stack, to package level where the die or die stack has been mounted to a package substrate. Accessing GAA transistors 104 from the backside offers the advantage of flexibility in when in the production cycle test and/or wire edit are performed. The techniques and structures illustrated in FIGS. 15-17 are shown relative to direct GAA transistor component contact; however, they may be used in the context of probe point structures deployment.

Figure 15:
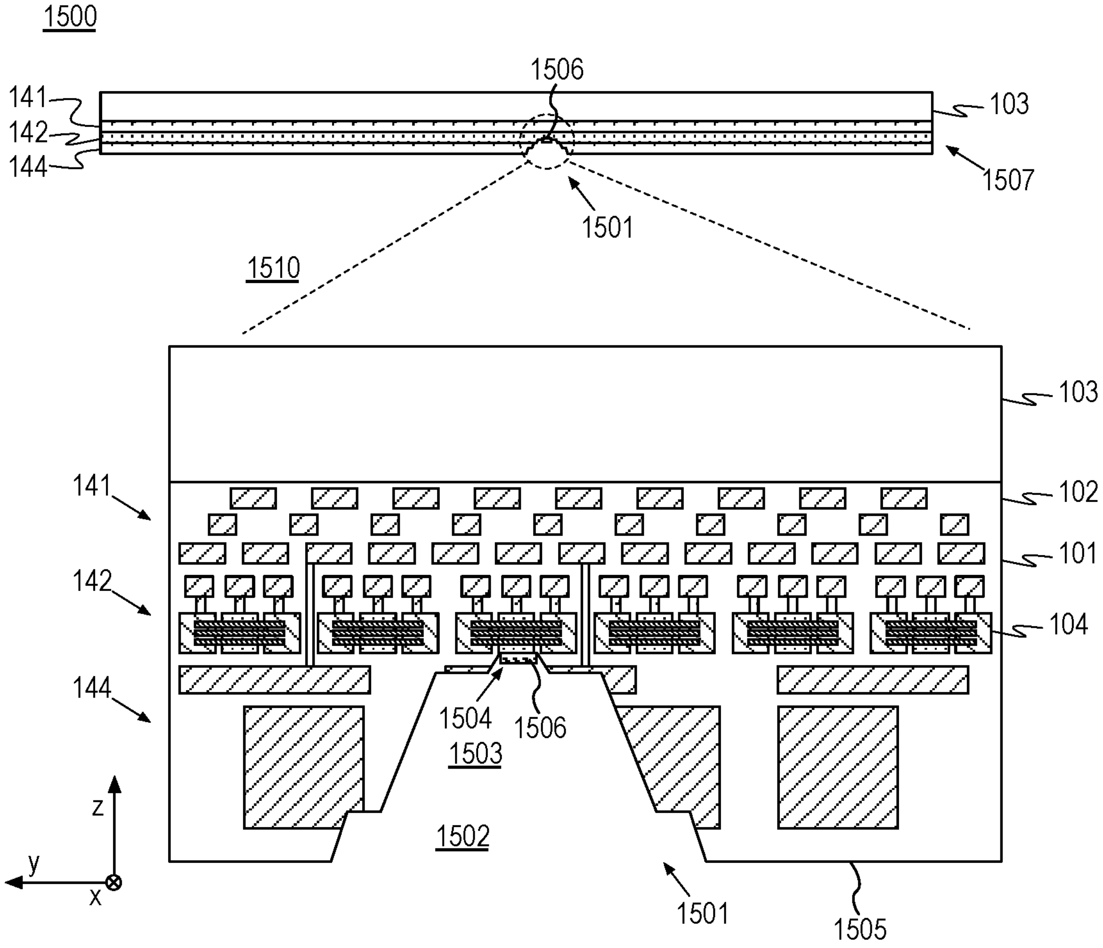
FIG. 15 illustrate cross-sectional side views of an example wafer level IC structure exposed for back side test and/or circuit edit.

FIG. 15 illustrate cross-sectional side views of an example wafer level IC structure 1500 exposed for back side test and/or circuit edit, arranged in accordance with at least some implementations of the present disclosure. As shown in FIG. 15, a wafer 1507 includes front side metallization layers 141, device layer 142, and back side metallization layers 144. One or more openings 1501 are formed in wafer 1507 to provide access to GAA transistors of device layer 142. Openings 1501 are formed using patterning and etch techniques, physical machining, electrochemical machining, FIB machining, FIB ablation, laser ablation, or the like.

As shown in expanded view 1510, opening 1501 may include a number of openings 1502, 1503, 1504 having reducing lateral dimensions moving from the back side of wafer 1507 into device layer 142. For example, opening 1502, which is at a back side surface 1505 of wafer 1507 may be wider than opening 1503, which is internal to wafer 1507, and is in turn wider than opening 1504, which provides access to GAA transistors 104. In some embodiments, after forming opening 1501, an edit wire 1506 is formed using any techniques discussed herein.

Figure 16:
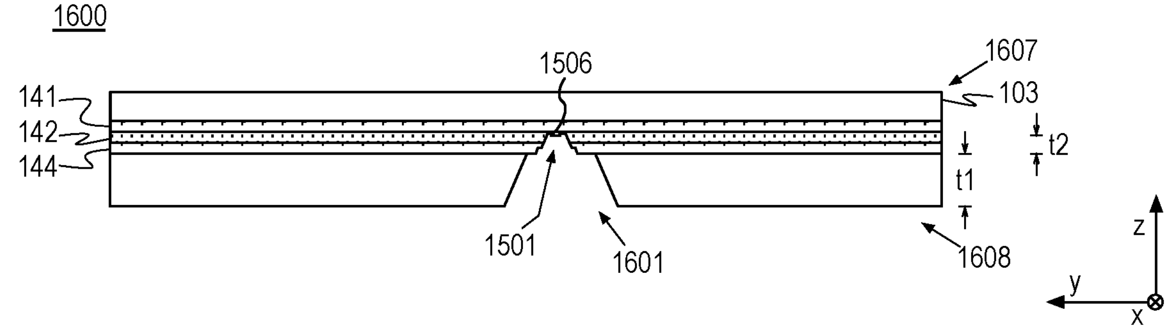
FIG. 16 illustrate cross-sectional side views of an example multi-die level IC structure exposed for back side test and/or circuit edit.
Figure 17:
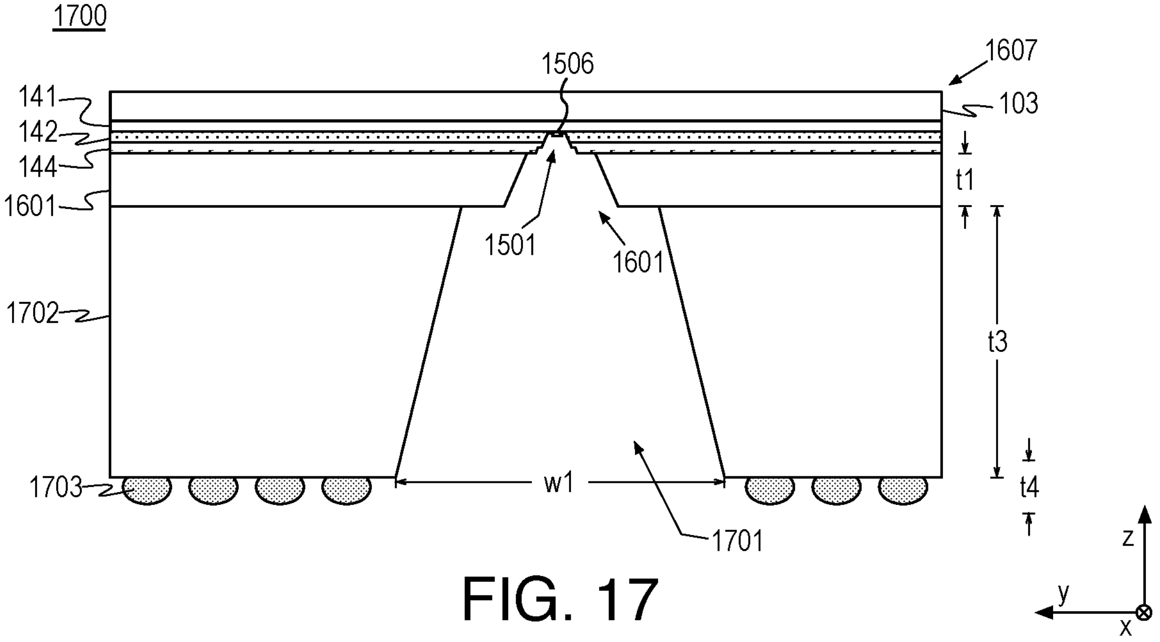
FIG. 17 illustrate cross-sectional side views of an example packaged multi-die level IC structure exposed for back side test and/or circuit edit.

FIG. 16 illustrate cross-sectional side views of an example multi-die level IC structure 1600 exposed for back side test and/or circuit edit, arranged in accordance with at least some implementations of the present disclosure. As shown in FIG. 16, a die 1607 including front side metallization layers 141, device layer 142, and back side metallization layers 144 may be singulated from wafer 1507 and then coupled to a second die 1608. For example, die 1607 may be a logic die and die 1608 may be base die. One or more openings 1601, optionally inclusive of an opening 1501, are formed through die 1608 and into die 1607 to provide access to GAA transistors of device layer 142. Openings 1601 are formed using patterning and etch techniques, physical machining, electrochemical machining, FIB machining, FIB ablation, laser ablation, or the like.

As shown in FIG. 16, the portion of opening 1601 through die 1608 may have a substantially greater depth or thickness t1 than a depth or thickness t2 of the portion of opening 1601 that extends into die 1607 (i.e., opening 1501). In some embodiments, thickness t1 is not less than three times thickness t2, not less than five times thickness t2, or not less than ten times thickness t2. In some embodiments, thickness t1 is in the range of 100 to 200 microns. In some embodiments, thickness t1 is about 150 microns.

FIG. 17 illustrate cross-sectional side views of an example packaged multi-die level IC structure 1700 exposed for back side test and/or circuit edit, arranged in accordance with at least some implementations of the present disclosure. As shown in FIG. 17, die 1607 inclusive of front side metallization layers 141, device layer 142, and back side metallization layers 144 and second die 1608 may be mounted to a package substrate 1702. One or more openings 1601, optionally inclusive of openings 1501, 1601, are formed through package substrate 1702 and die 1608, and into die 1607 to provide access to GAA transistors of device layer 142. Openings 1701 are formed using patterning and etch techniques, physical machining, electrochemical machining, FIB machining, FIB ablation, laser ablation, or the like.

As shown in FIG. 17, the portion of opening 1701 through package substrate 1702 may have a substantially greater depth or thickness t3 than depth or thickness t1 of opening 1601 through die 1608. In some embodiments, thickness t3 is not less than five times thickness t1, not less than eight times thickness t1, or not less than ten times thickness t1. In some embodiments, thickness t3 is in the range of 1 mm to 1.5 mm. In some embodiments, thickness t1 is about 1.2 mm. Furthermore, opening 1701 may have a width w1 in the range of about 0.5 to 2 mm, a width w1 in the range of about 0.75 to 1.5 mm, or a width w1 in the range of about 0.8 to 1.2 mm. In some embodiments, width w1 is about 1.0 mm. Also as shown, package level interconnects 1703 may be provided on package substrate 1702. Interconnects 1703 may also be removed during formation of openings 1701. Interconnects 1703 may have any suitable thickness such as a thickness of about 200 microns.

Figure 18:
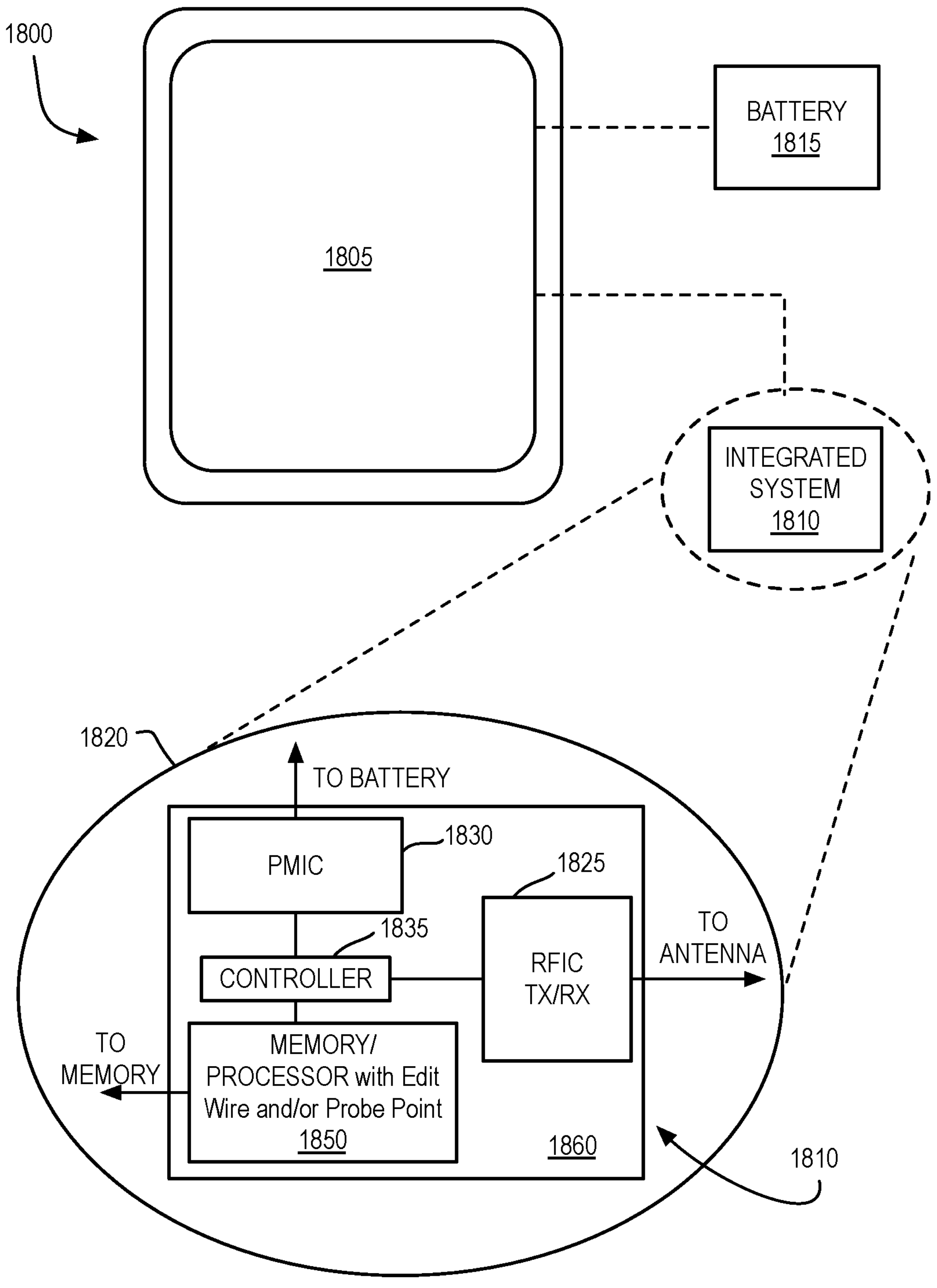
FIG. 18 is an illustrative diagram of a mobile computing platform employing a device having an edit wire and/or a probe point structure.

FIG. 18 is an illustrative diagram of a mobile computing platform 1800 employing a device having an edit wire and/or a probe point structure, arranged in accordance with at least some implementations of the present disclosure. Any IC structure, die, or device inclusive of any components, materials, or characteristics discussed herein may be implemented by any component of mobile computing platform 1800. Mobile computing platform 1800 may be any portable device configured for each of electronic data display, electronic data processing, wireless electronic data transmission, or the like. For example, mobile computing platform 1800 may be any of a tablet, a smart phone, a netbook, a laptop computer, etc. and may include a display screen 1805, which in the exemplary embodiment is a touchscreen (e.g., capacitive, inductive, resistive, etc. touchscreen), a chip-level (system on chip—SoC) or package-level integrated system 1810, and a battery 1815. Battery 1815 may include any suitable device for providing electrical power such as a device consisting of one or more electrochemical cells and electrodes to couple to an outside device. Mobile computing platform 1800 may further include a power supply to convert a source power from a source voltage to one or more voltages employed by other devices of mobile computing platform 1800.

Integrated system 1810 is further illustrated in the expanded view 1820. In the exemplary embodiment, packaged device 1850 (labeled "Memory/Processor" in FIG. 18) includes at least one memory chip (e.g., RAM), and/or at least one processor chip (e.g., a microprocessor, a multi-core microprocessor, or graphics processor, or the like). In an embodiment, the package device 1850 is a microprocessor including an SRAM cache memory. As shown, device 1850 may employ a die or device having any edit wire and/or probe point structure and/or related characteristics discussed herein. Packaged device 1850 may be further coupled to (e.g., communicatively coupled to) a board, a substrate, or an interposer 1860 along with, one or more of a power management integrated circuit (PMIC) 1830, RF (wireless) integrated circuit (RFIC) 1825 including a wideband RF (wireless) transmitter and/or receiver (TX/RX) (e.g., including a digital baseband and an analog front end module further comprises a power amplifier on a transmit path and a low noise amplifier on a receive path), and a controller 1835 thereof. In general, packaged device 1850 may also be coupled to (e.g., communicatively coupled to) display screen 1805. One or both of PMIC 1830 and RFIC 1825 may employ a die or device having any edit wire, probe point structure, and/or related characteristics discussed herein.

Functionally, PMIC 1830 may perform battery power regulation, DC-to-DC conversion, etc., and so has an input coupled to battery 1815 and with an output providing a current supply to other functional modules. In an embodiment, PMIC 1830 may perform high voltage operations. As further illustrated, in the exemplary embodiment, RFIC 1825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1850 or within a single IC (SoC) coupled to the package substrate of the packaged device 1850.

Figure 19:
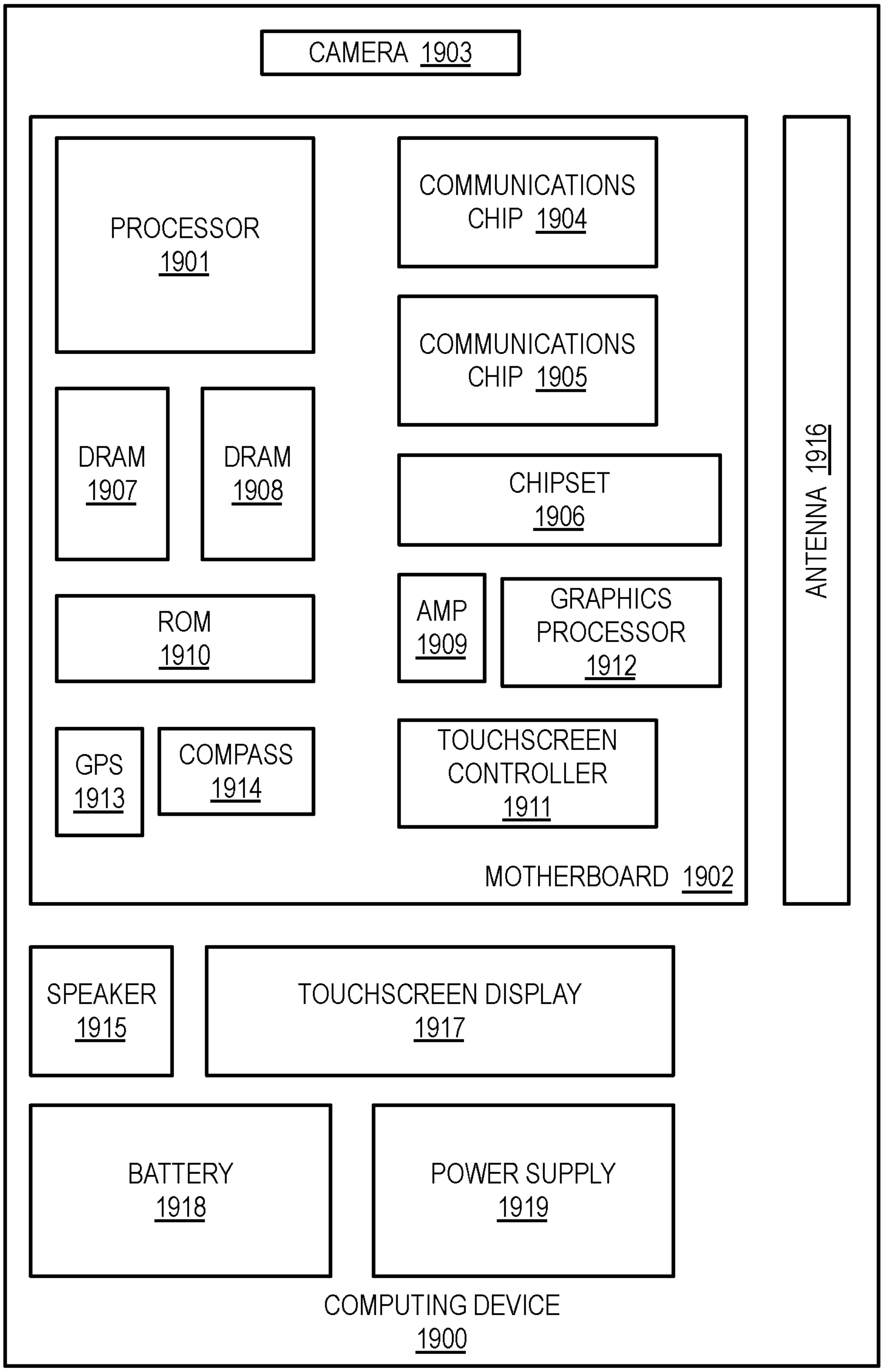
FIG. 19 is a functional block diagram of a computing device, all arranged in accordance with at least some implementations of the present disclosure.

FIG. 19 is a functional block diagram of a computing device 1900, arranged in accordance with at least some implementations of the present disclosure. Computing device 1900 may be found inside platform 1800, for example, and further includes a motherboard 1902 hosting a number of components, such as but not limited to a processor 1901 (e.g., an applications processor) and one or more communications chips 1904, 1905. Processor 1901 may be physically and/or electrically coupled to motherboard 1902. In some examples, processor 1901 includes an integrated circuit die packaged within the processor 1901. In general, the term "processor" may refer to any device or portion of a device that processes electronic data from registers and/or memory to transform that electronic data into other electronic data that may be stored in registers and/or memory. Any one or more device or component of computing device 1900 may include a die or device having any edit wire, probe point structure, and/or related characteristics discussed herein as discussed herein.

In various examples, one or more communication chips 1904, 1905 may also be physically and/or electrically coupled to the motherboard 1902. In further implementations, communication chips 1904 may be part of processor 1901. Depending on its applications, computing device 1900 may include other components that may or may not be physically and electrically coupled to motherboard 1902. These other components may include, but are not limited to, volatile memory (e.g., DRAM) 1907, 1908, non-volatile memory (e.g., ROM) 1910, a graphics processor 1912, flash memory, global positioning system (GPS) device 1913, compass 1914, a chipset 1906, an antenna 1916, a power amplifier 1909, a touchscreen controller 1911, a touchscreen display 1917, a speaker 1915, a camera 1903, a battery 1918, and a power supply 1919, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1904, 1905 may enable wireless communications for the transfer of data to and from the computing device 1900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1904, 1905 may implement any of a number of wireless standards or protocols, including but not limited to those described elsewhere herein. As discussed, computing device 1900 may include a plurality of communication chips 1904, 1905. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1919 may convert a source power from a source voltage to one or more voltages employed by other devices of computing device 1900. In some embodiments, power supply 1919 converts an AC power to DC power. In some embodiments, power supply 1919 converts an DC power to DC power at one or more different (lower) voltages. In some embodiments, multiple power supplies are staged to convert from AC to DC and then from DC at a higher voltage to DC at a lower voltage as specified by components of computing device 1900.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In one or more first embodiments, an integrated circuit (IC) device comprises a gate-all-around transistor comprising a gate structure between a source and a drain, a gate contact, a source contact, and a drain contact on top surfaces of the gate structure, the source, and the drain, respectively, a probe point structure consisting of a first surface and a plurality of second surfaces, wherein the first surface is in contact with a bottom surface of at least one of the gate structure, the source, or the drain, and one or more dielectric materials in contact with the second surfaces.

In one or more second embodiments, further to the first embodiments, the IC device further comprises a front side metallization layer over the gate contact, the source contact, and the drain contact and a back side metallization layer under the bottom surfaces of the gate, the source, and the drain, wherein the probe point structure is electrically isolated from the front and back side metallization layers.

In one or more third embodiments, further to the first or second embodiments, the IC device further comprises a second probe point structure in contact with a bottom surface of a second gate-all-around transistor, a third probe point structure in contact with a bottom surface of a third gate-all-around transistor, and a wire on the second probe point structure and the third probe point structure.

In one or more fourth embodiments, further to the first through third embodiments, the wire comprises a first metal and the back side metallization layer comprises a second metal.

In one or more fifth embodiments, further to the first through fourth embodiments, an entirety of the back side metallization layer is under the probe point structure.

In one or more sixth embodiments, further to the first through fifth embodiments, the front side metallization layer is coupled to the back side metallization layer by a via.

In one or more seventh embodiments, a method for editing an integrated circuit (IC) structure comprises receiving the IC structure comprising a gate-all-around transistor comprising a gate structure between a source and a drain, the IC structure comprising a gate contact, a source contact, and a drain contact on front side surfaces of the gate structure, the source, and the drain, respectively, exposing a back side surface of at least one of the gate structure, the source, or the drain, and forming a wire by direct write deposition, the wire comprising a first end on the back side surface of at least one of the gate structure, the source, or the drain and a second end on a second circuit structure.

In one or more eighth embodiments, further to the seventh embodiments, said direct write deposition comprises one of focused ion beam deposition, electron beam deposition, or direct writing lithography.

In one or more ninth embodiments, further to the seventh or eighth embodiments, the first end is on the back side surface of the gate structure and the second end is on a back side surface of a second gate structure of a second gate-all-around transistor.

In one or more tenth embodiments, further to the seventh through ninth embodiments, the first end is on the back side surface of the gate structure and the second end is on a back side surface of a second source or second drain of a second gate-all-around transistor.

In one or more eleventh embodiments, further to the seventh through tenth embodiments, the IC structure comprises a front side metallization layer over a device layer, the device layer comprising the gate-all-around transistor, and the method further comprises exposing, by removing a portion of the device layer, a first metallization feature of the front side metallization layer comprising the second circuit structure, wherein the second end of the wire is on the first metallization feature.

In one or more twelfth embodiments, further to the seventh through eleventh embodiments, the IC structure comprises a front side metallization layer over a device layer, the device layer comprising the gate-all-around transistor, and a back side metallization layer under the device layer, wherein said exposing the back side surface comprises removing a portion of the back side metallization layer to expose the back side surface of at least one of the gate structure, the source, or the drain.

In one or more thirteenth embodiments, further to the seventh through twelfth embodiments, a first die comprises the IC structure, wherein the first die is mounted to a second die, and wherein said exposing the back side surface comprises removing a portion of the second die to expose the first die.

In one or more fourteenth embodiments, further to the seventh through thirteenth embodiments, the second die is mounted to a package substrate, and wherein said exposing the back side surface comprises removing a portion of the package substrate to expose the second die.

In one or more fifteenth embodiments, a method for testing or editing an integrated circuit (IC) structure comprises receiving the IC structure comprising a gate-all-around transistor comprising a gate structure between a source and a drain; a gate contact, a source contact, and a drain contact on front side surfaces of the gate structure, the source, and the drain, respectively; and a probe point structure in contact with a back side surface of the gate structure, the source, or the drain, the probe point structure to be decoupled from a back side metallization of the IC structure, and contacting the probe point structure with a probe signal or forming a wire by direct write deposition, a portion of the wire on the probe point structure.

In one or more sixteenth embodiments, further to the fifteenth embodiments, wherein the probe point structure is contacted with the probe signal, and wherein the probe signal is one of an electrical test signal provided via a metal probe tip or an electron beam signal provided via an electron beam prober.

In one or more seventeenth embodiments, further to the fifteenth or sixteenth embodiments, the method further comprises exposing the probe point structure by removing a portion of the back side metallization.

In one or more eighteenth embodiments, further to the fifteenth through seventeenth embodiments, said exposing further comprising removing a portion of one of a base die coupled to the IC structure or a package substrate coupled to the IC structure.

In one or more nineteenth embodiments, further to the fifteenth through eighteenth embodiments, the method further comprises forming the back side metallization subsequent to said contacting the probe point structure or direct write deposition of the wire.

In one or more twentieth embodiments, further to the fifteenth through nineteenth embodiments, the wire is formed by direct write deposition, the direct write deposition comprising one of focused ion beam processing, electron beam deposition, or direct writing lithography.

In one or more twenty-first embodiments, further to the fifteenth through twentieth embodiments, the probe point structure is on the back side surface of the gate structure, a first end of the wire is on the probe point structure, and a second end of the wire is on a second probe point structure on a back side surface of a second source, a second drain, or a second gate of a second gate-all-around transistor of the IC structure.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A method for editing an integrated circuit (IC) structure, comprising:

receiving the IC structure comprising a gate-all-around transistor comprising a gate structure between a source and a drain, the IC structure comprising a gate contact, a source contact, a drain contact on front side surfaces of the gate structure, the source, and the drain, respectively, and a front side metallization layer over a device layer comprising the gate-all-around transistor;

exposing a back side surface of at least one of the gate structure, the source, or the drain;

exposing, by removing a portion of the device layer, a metallization feature of the front side metallization layer; and forming a wire by direct write deposition, the wire comprising a first end on the back side surface of the at least one of the gate structure, the source, or the drain and a second end on the metallization feature.

2. The method of claim 1, wherein said direct write deposition comprises one of focused ion beam deposition, electron beam deposition, or direct writing lithography.

3. The method of claim 1, wherein the first end is on the back side surface of the gate structure.

4. The method of claim 1, wherein the metallization feature comprises a metal line and the front side metallization layer is a first metallization layer (M0).

5. The method of claim 1, wherein the IC structure comprises a back side metallization layer under the device layer, wherein said exposing the back side surface comprises removing a portion of the back side metallization layer to expose the back side surface of the at least one of the gate structure, the source, or the drain.

6. The method of claim 5, wherein a first die comprises the IC structure, wherein the first die is mounted to a second die, and wherein said exposing the back side surface comprises removing a portion of the second die to expose the first die.

7. The method of claim 6, wherein the second die is mounted to a package substrate, and wherein said exposing the back side surface comprises removing a portion of the package substrate to expose the second die.

8. The method of claim 1, wherein the wire comprises a first metal composition and the metallization feature comprises a second metal composition.

9. A method for editing an integrated circuit (IC) structure, comprising:

receiving the IC structure comprising a gate-all-around transistor comprising a gate structure between a source and a drain, the IC structure comprising a gate contact, a source contact, a drain contact on front side surfaces of the gate structure, the source, and the drain, respectively, a front side metallization layer over a device layer comprising the gate-all-around transistor, and a back side metallization layer under the device layer, and wherein a first die comprises the IC structure and the first die is mounted to a second die;

exposing a back side surface of at least one of the gate structure, the source, or the drain by removing a portion of the second die to expose the first die and removing a portion of the back side metallization layer to expose the back side surface of at least one of the gate structure, the source, or the drain; and forming a wire by direct write deposition, the wire comprising a first end on the back side surface of at least one of the gate structure, the source, or the drain and a second end on a second circuit structure.

10. The method of claim 9, wherein said direct write deposition comprises one of focused ion beam deposition, electron beam deposition, or direct writing lithography.

11. The method of claim 9, wherein the first end is on the back side surface of the gate structure and the second end is on a back side surface of a second gate structure of a second gate-all-around transistor.

12. The method of claim 9, wherein the first end is on the back side surface of the gate structure and the second end is on a back side surface of a second source or second drain of a second gate-all-around transistor.

13. The method of claim 9, further comprising:

exposing, by removing a portion of the device layer, a first metallization feature of the front side metallization layer comprising the second circuit structure, wherein the second end of the wire is on the first metallization feature.

14. The method of claim 9, wherein the second die is mounted to a package substrate, and wherein said exposing the back side surface comprises removing a portion of the package substrate to expose the second die.

* * * * *